(12) United States Patent
Chaput

(10) Patent No.: US 11,508,897 B2
(45) Date of Patent: Nov. 22, 2022

(54) DRIVER FOR A CIRCUIT WITH A CAPACITIVE LOAD

(71) Applicant: President and Fellows of Harvard College, Cambridge, MA (US)

(72) Inventor: Simon Chaput, Magog (CA)

(73) Assignee: President and Fellows of Harvard College, Cambridge, MA (US)

( * ) Notice: Subject to any disclaimer, the term of this patent is extended or adjusted under 35 U.S.C. 154(b) by 481 days.

(21) Appl. No.: 16/845,251

(22) Filed: Apr. 10, 2020

(65) Prior Publication Data

US 2020/0243744 A1   Jul. 30, 2020

Related U.S. Application Data

(60) Continuation of application No. 16/220,171, filed on Dec. 14, 2018, now Pat. No. 11,239,404, which is a
(Continued)

(51) Int. Cl.
*H01L 41/04* (2006.01)
*H02M 3/335* (2006.01)
(Continued)

(52) U.S. Cl.
CPC ........ *H01L 41/042* (2013.01); *H02M 3/1582* (2013.01); *H02M 3/335* (2013.01); *H02M 7/537* (2013.01); *H02M 1/007* (2021.05)

(58) Field of Classification Search
CPC ..... H01L 41/02; H02M 3/1582; H02M 3/335; H02M 2001/007; H02M 7/537
See application file for complete search history.

(56) References Cited

U.S. PATENT DOCUMENTS 5,969,484 A   10/1999   Santi et al.
6,781,422 B1   8/2004   Yang
(Continued)

FOREIGN PATENT DOCUMENTS

EP   2763317   8/2014
WO   2009152468   12/2009
(Continued)

OTHER PUBLICATIONS

Karpelson, et al; "Driving High Voltage Piezoelectric Actuators in Microrobotic Applications"; Sensors and Actuators A: Physical, 2011.
(Continued)

*Primary Examiner* — J. San Martin
(74) *Attorney, Agent, or Firm* — Peter A. Nieves; Sheehan Phinney Bass & Green PA

(57) ABSTRACT

A driver for a circuit with a capacitive load, includes a power converter configured to receive a DC input voltage from an input stage, generate a switching voltage at a switching node, and output an output voltage forming an analog waveform at an output stage. The power converter includes a first switch connected between an inductive device and a ground, a second switch connected between the inductive device and the output stage, and a controller to control the first switch and the second switch. The analog waveform has an amplitude at least two times greater than the input voltage.

21 Claims, 18 Drawing Sheets

Related U.S. Application Data division of application No. 15/848,526, filed on Dec. 20, 2017, now Pat. No. 10,199,555, which is a continuation of application No. PCT/US2016/053915, filed on Sep. 27, 2016.

(60) Provisional application No. 62/266,318, filed on Dec. 11, 2015, provisional application No. 62/233,631, filed on Sep. 28, 2015.

(51) Int. Cl.
*H02M 3/158* (2006.01)
*H02M 7/537* (2006.01)
*H02M 1/00* (2006.01)

(56) References Cited

U.S. PATENT DOCUMENTS

| | | | |
|---|---|---|---|
| 8,233,297 | B2 | 7/2012 | Kim |
| 11,024,793 | B1 | 6/2021 | Chaput |
| 2005/0104473 | A1 | 5/2005 | Yoshida |
| 2009/0251925 | A1 | 10/2009 | Usui et al. |
| 2010/0052963 | A1 | 3/2010 | Soude et al. |
| 2011/0261599 | A1 | 10/2011 | Duerbaum et al. |
| 2011/0305356 | A1 | 12/2011 | Kwan et al. |
| 2012/0019217 | A1 | 1/2012 | Jenni et al. |
| 2012/0063184 | A1 | 3/2012 | Mazumder |
| 2012/0081233 | A1 | 4/2012 | Garrity |
| 2012/0268969 | A1 | 10/2012 | Cuk |
| 2013/0039104 | A1* | 2/2013 | Sharma ............ H02M 1/10 363/123 |
| 2014/0009981 | A1 | 1/2014 | Charles Knill |
| 2014/0070665 | A1 | 3/2014 | Muggler et al. |
| 2014/0166856 | A1 | 6/2014 | Kato et al. |
| 2015/0015072 | A1 | 1/2015 | Deboy et al. |
| 2015/0041104 | A1 | 2/2015 | De Bock et al. |
| 2015/0137793 | A1 | 5/2015 | Englund et al. |
| 2015/0227204 | A1 | 8/2015 | Gipson et al. |
| 2015/0340952 | A1 | 11/2015 | Manohar |
| 2018/0115246 | A1 | 4/2018 | Azrai |

FOREIGN PATENT DOCUMENTS

| | | |
|---|---|---|
| WO | 2012131361 | 10/2012 |
| WO | 2015028852 | 3/2015 |

OTHER PUBLICATIONS

Krischnamachari, et al; "Bidirectional Buck-Boost Converter with Variable Output Voltage", IEEE, 1998.
Huang et al; "A Review of High Voltage Drive Amplifiers for Capacitive Actuators", 2012 47th International Universities Power Engineering Conference (UPEC).
International Search Report and Written Opinion for PCT/US16/53915 dated Feb. 21, 2017.
European Search Report for EP16852394.2 dated Apr. 12, 2019.

* cited by examiner

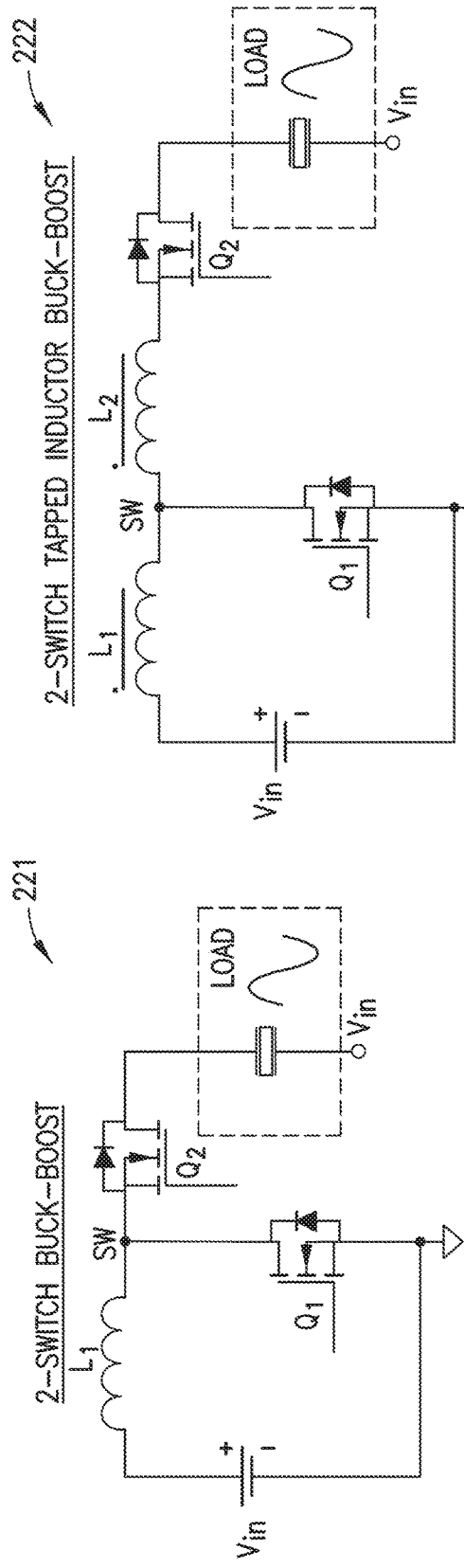

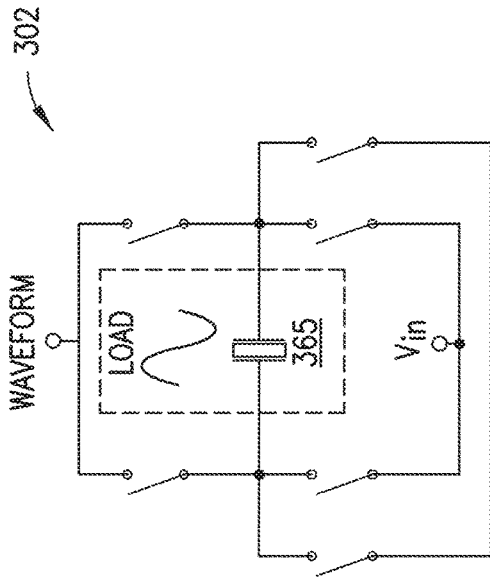
FIG.3A
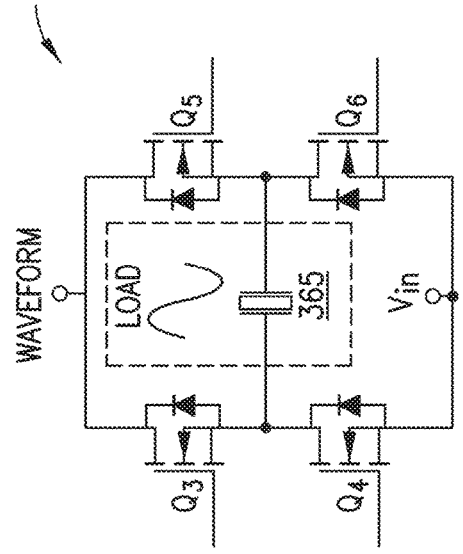
FIG.3B
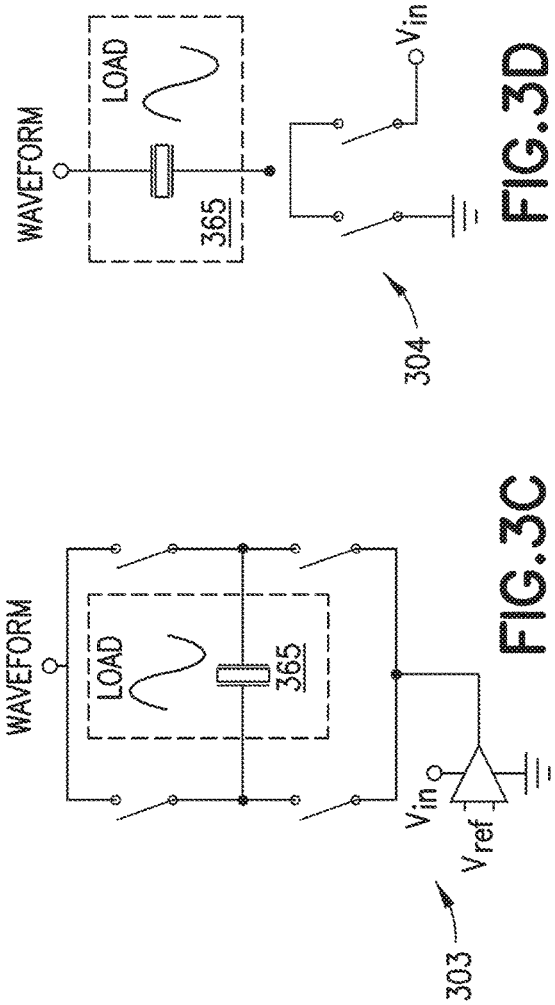
FIG.3C
FIG.3D
FIG.3E

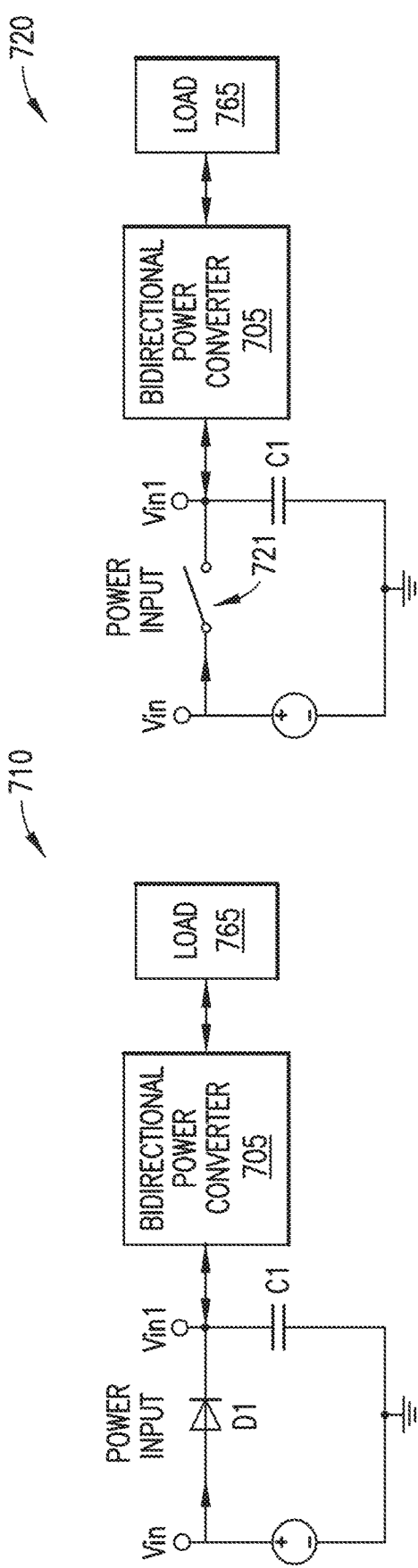
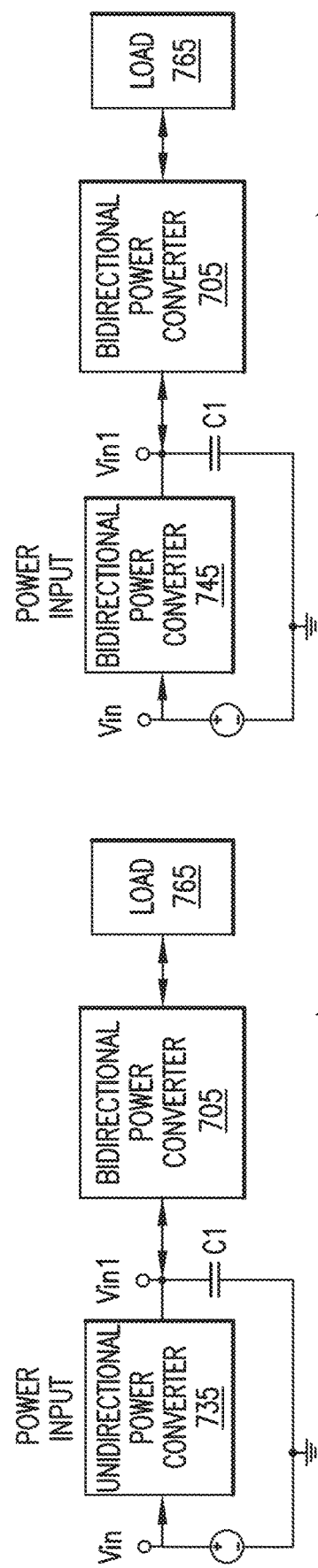
FIG.6A
FIG.6B
FIG.6C
FIG.6D

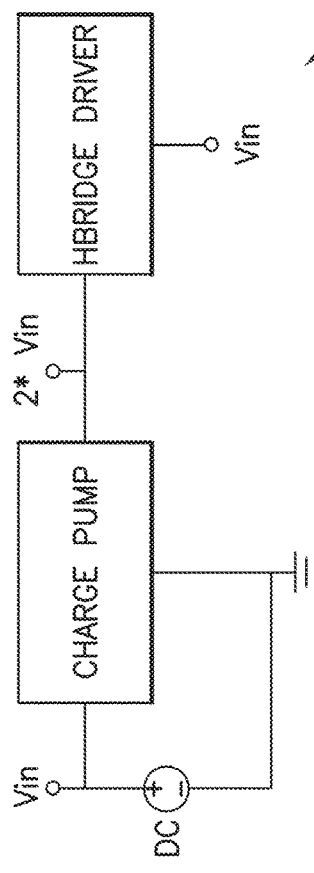
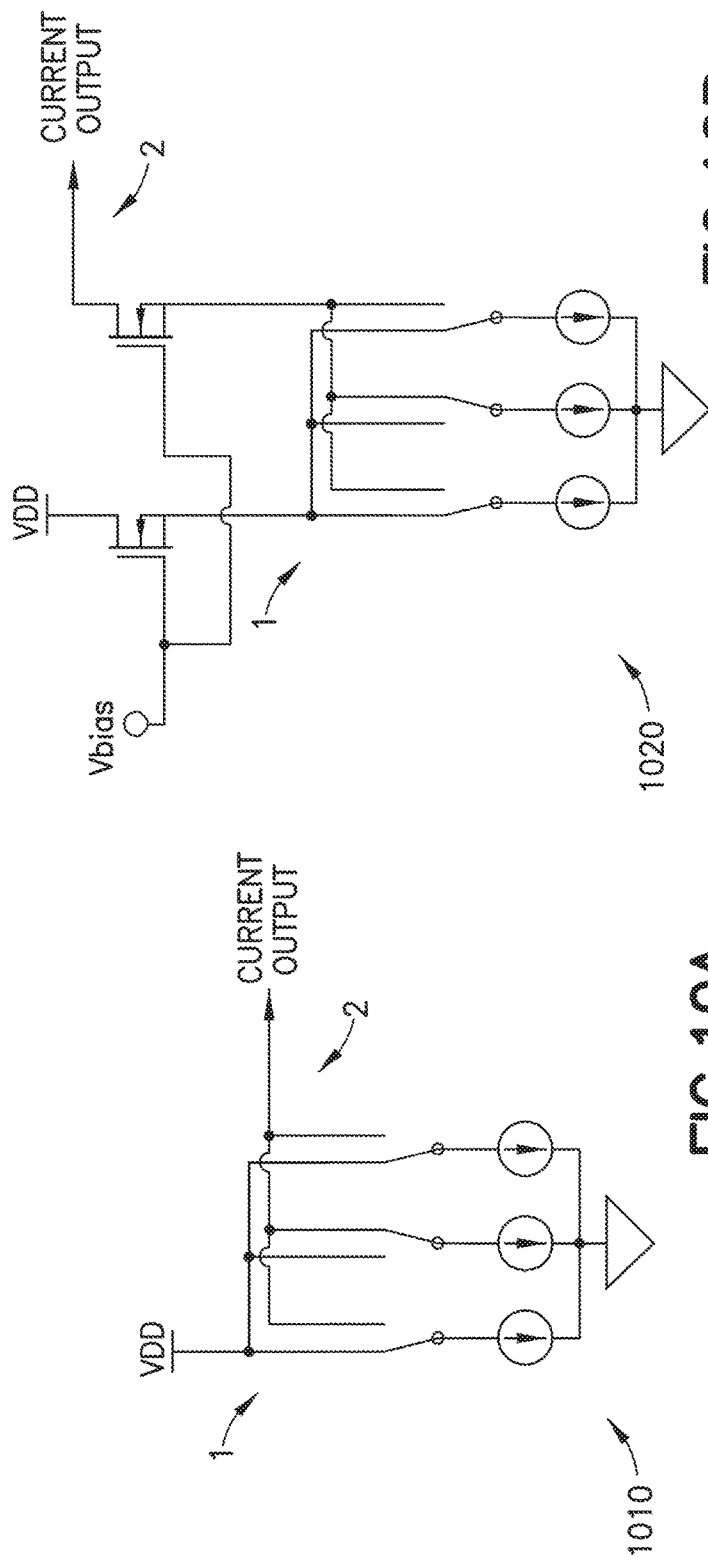

DRIVER FOR A CIRCUIT WITH A CAPACITIVE LOAD

CROSS-REFERENCE TO RELATED APPLICATIONS

This application is a continuation of U.S. patent application Ser. No. 16/220,171, filed Dec. 14, 2018, entitled "Method for Reducing Losses and Distortion in a Driver with a Capacitive Load", which is a divisional of U.S. patent application Ser. No. 15/848,526 filed Dec. 20, 2017, entitled "Driver for a High Voltage Capacitive Actuator," which is a continuation of application PCT/US2016/053915, entitled "Driver for a High Voltage Capacitive Actuator" filed Sep. 27, 2016, and claims the benefit of U.S. Provisional Patent Application Ser. No. 62/233,631, filed Sep. 28, 2015, entitled "COMPACT, LOW-POWER, AND NOISELESS ACTUATOR DRIVER," and U.S. Provisional Patent Application Ser. No. 62/266,318, filed Dec. 11, 2015, entitled "Piezoelectric Driver," each of which is incorporated by reference herein in their entireties.

FIELD OF THE INVENTION

The present invention relates to the control circuitry (driver) for high voltage capacitive actuators, for example, electrostatic, electro-mechanical polymer (EMP), electro-active polymer (EAP), and piezoelectric actuators.

BACKGROUND OF THE INVENTION

Active cooling systems, such as fans, face multiple challenges when implemented in ultrathin devices, such as tablet or laptop computers. General Electric (GE) has developed a cooling device using two piezoelectric membranes, called a Dual Piezoelectric Cooling Jet (DCJ). The piezoelectric membranes are electrically activated, causing them to expand and contract, forming a cavity that spills air at a high velocity, for example, like a bellows. However, the DCJ is an energy intensive device, and a DCJ driver may be large and expensive. Further, the DCJ membranes operate like a speaker/transducer, so that any oscillations within the human hearing band (approximately 200 Hz to 20 KHz), for example, due to noise or distortion in the driver signal, may be audibly detected.

FIG. 19 shows a prior art topology for a single-phase voltage source inverter for renewable energy sources. The circuit includes an input stage, a buck-boost stage, and an unfolding stage. It was implemented in discrete parts due to the high power to process. This circuit is based on a typical PI controller or Energy controller and very low fixed frequency switching. This typically leads to very high distortion level (>5%), low power efficiency at low power output and very limited boost voltage ratio≈3.5 (Vout/Vin). Therefore, there is a need in the industry to address one or more of the abovementioned shortcomings.

SUMMARY OF THE INVENTION

Embodiments of the present invention provide a driver for a circuit with a capacitive load. Briefly described, the driver includes a power converter configured to receive a DC input voltage from an input stage, generate a switching voltage at a switching node, and output an output voltage forming an analog waveform at an output stage. The power converter includes a first switch connected between an inductive device and a ground, a second switch connected between the inductive device and the output stage, and a controller to control the first switch and the second switch. The analog waveform has an amplitude at least two times greater than the input voltage.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

FIG. 2A is a circuit diagram for a 2-switch buck-boost driver first alternative to the buck-boost driver of FIG. 1.

FIG. 2B is a circuit diagram for a 2-switch tapped inductor buck-boost driver second alternative to the buck-boost driver of FIG. 1.

FIG. 2C is a circuit diagram for a 2-switch flyback buck-boost driver third alternative to the buck-boost driver of FIG. 1.

FIG. 2D is a circuit diagram for a 2-switch flyback buck-boost low side secondary switch fourth alternative to the buck-boost driver of FIG. 1.

FIG. 3A is a circuit diagram illustrating an output configuration with a full-bridge connected to a capacitive load.

FIG. 3B is a circuit diagram illustrating an output configuration in which a full-bridge with discrete voltage reference choices is connected to a capacitive load.

FIG. 3C is a circuit diagram illustrating an output configuration in which a full bridge with an analog variable reference is connected to a capacitive load.

FIG. 3D is a circuit diagram illustrating an output configuration with load connected to a discrete variable reference.

FIG. 3E is a circuit diagram illustrating an output configuration with a load connected to variable analog reference.

FIG. 6A illustrates a first alternative embodiment of the unidirectional power input.

FIG. 6B illustrates a second alternative embodiment of the unidirectional power input where losses in the input are lowered by using an active switch.

FIG. 6C illustrates a third alternative embodiment of the unidirectional power input where, more generally, any power converter can be used.

FIG. 6D illustrates a first alternative embodiment of the converter with a bi-directional converter for the input.

FIG. 8 is a schematic diagram of an exemplary floating low voltage supply.

FIG. 10A is a circuit diagram of a standard current DAC converter.

FIG. 10B is a circuit diagram of an enhanced current DAC for rapid settling of the current output node.

DETAILED DESCRIPTION

Figure 1:
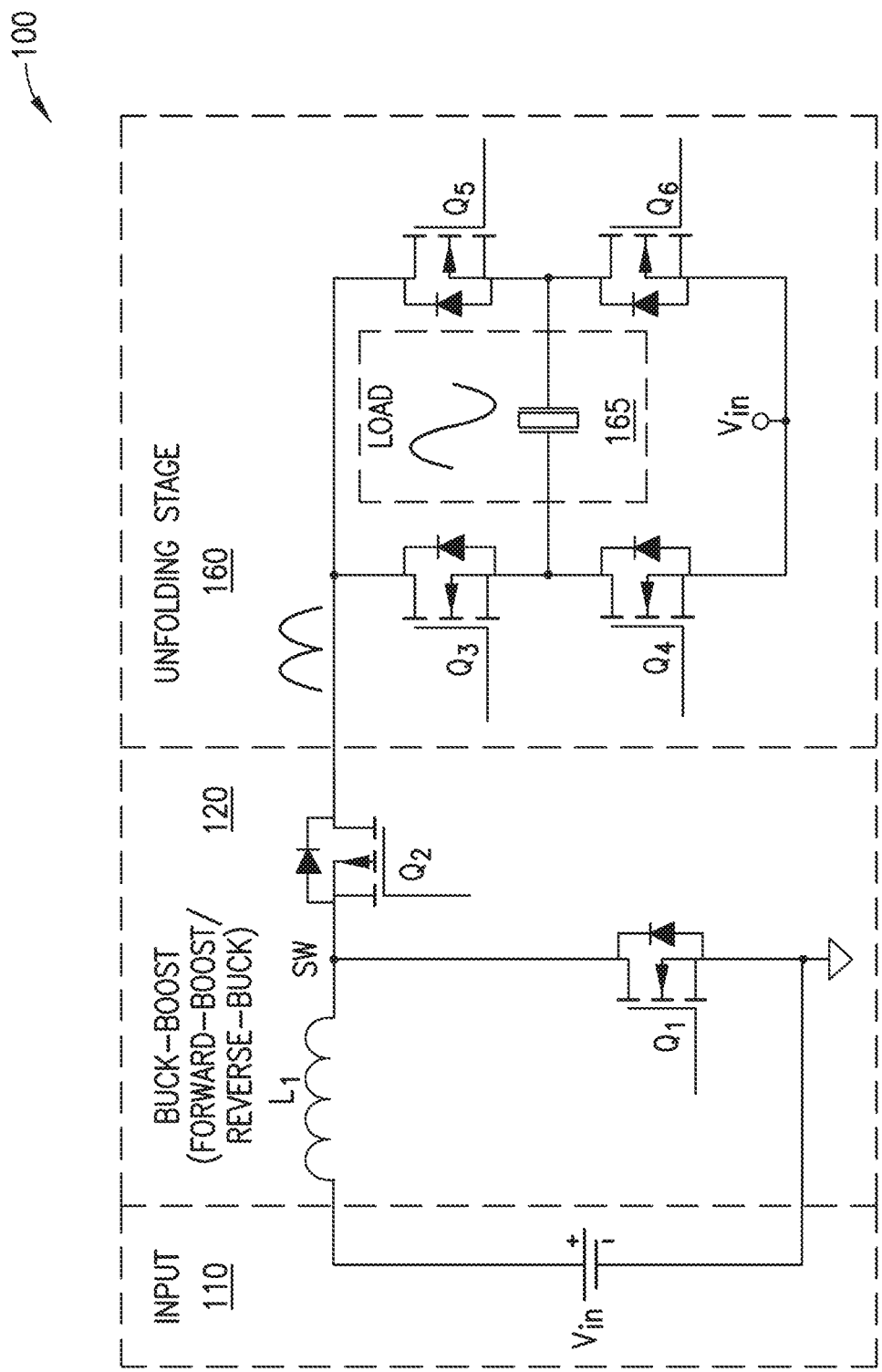
FIG. 1 is a schematic diagram depicting an exemplary first embodiment driver topology.

Reference will now be made in detail to embodiments of the present invention, examples of which are illustrated in the accompanying drawings. Wherever possible, the same reference numbers are used in the drawings and the description to refer to the same or like parts.

Figure 19:
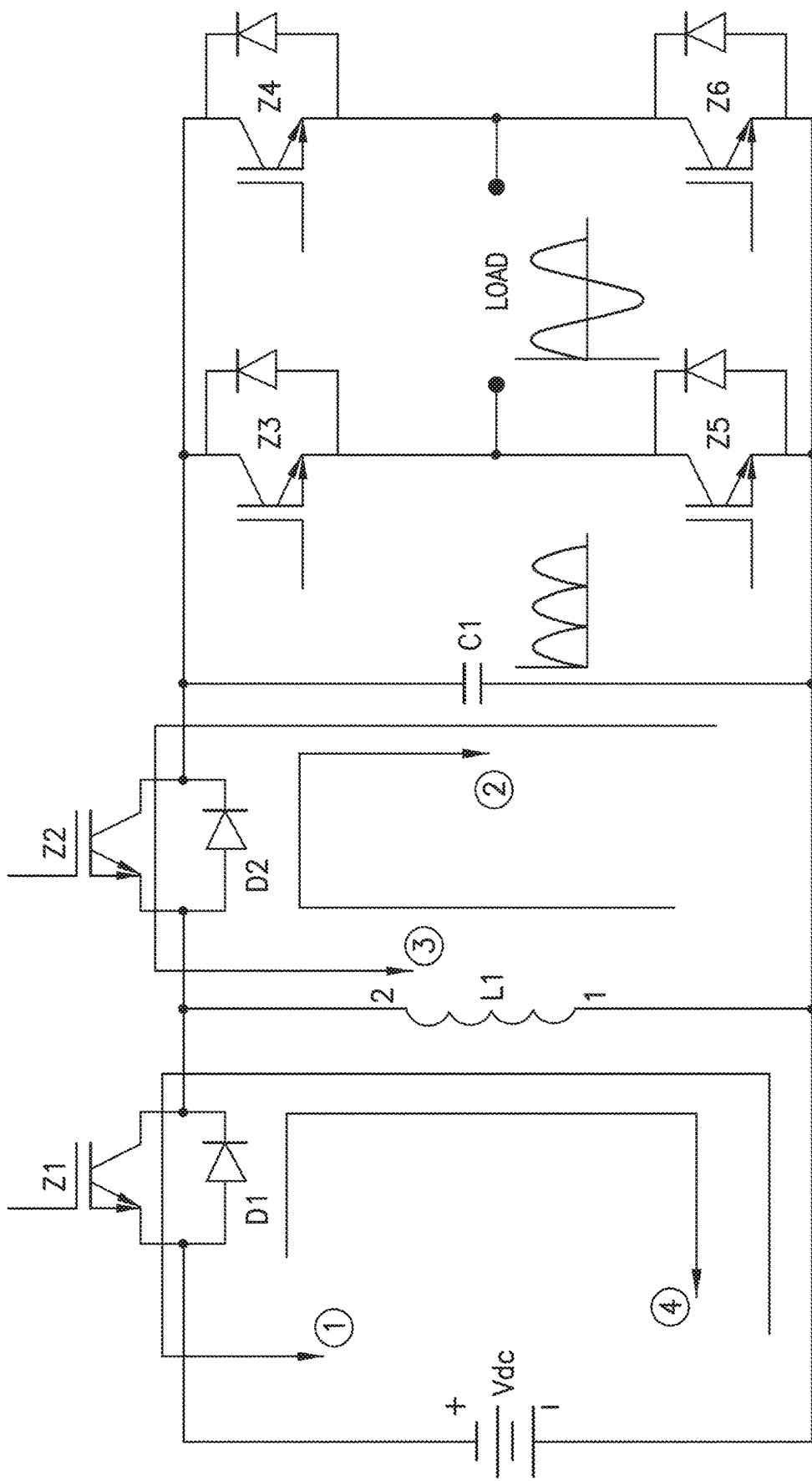
FIG. 19 is a schematic diagram depicting a prior art driver topology.

In contrast to the prior art driver shown in FIG. 19, embodiments of the driver under the present invention may boost a voltage ratio in excess of 10 and may achieve a distortion level lower than 1% while being very efficient at a low power output. Implementing the topology using discrete parts for a piezoelectric driver is not an option due to size and cost constraints, but a highly integrated topology is not straightforward as most CMOS processes cannot accommodate efficient bi-directional operation of the converter due to process limitations.

While the topology used in the present embodiments has similarities to the circuit of FIG. 19, the implementation of the topology in a single integrated circuit achieving significantly lower distortion and high power efficiency while used to drive capacitive load such as piezoelectric actuators is an important step forward to enable a variety of new applications such a high definition haptic feedback in mobile devices, and piezo cooling fans, among others.

Exemplary embodiments of a capacitive driver, for example, a driver for a dual piezoelectric cooling jet (DCJ), include a power converter configured to receive an input voltage yin as input and generate a clean folded sine waveform as an output, an unfolding stage referenced to yin, configured to receive the clean folded sine waveform from the converter and unfold the folded sine waveform into a sinusoidal waveform, and a controller configured to control the driver. The converter may be configured for bi-directional operation.

FIG. 1 shows an exemplary first embodiment 100 of a topology for a single-phase voltage source. The first embodiment 100 may be described as a pseudo-dc-link bi-directional driver with a single inductor $L_1$, that provides a total harmonic distortion (THD) lower than 0.5% and brings the power close to the effective power used by the load. Exemplary results from a prototype produced a total power of 64.04 mW and a THD+N of 0.38% for a 100 Vpp 150 Hz sinusoid in a 150 nF load from a 3.6 V power supply.

The circuit of the first embodiment 100 includes an input stage 110, a forward-boost/reverse-buck stage 120, and an unfolding stage 160. The circuit of the first embodiment 100 may be implemented in discrete parts due to the high power to process. The input stage may include a voltage source $V_{in}$, such as a battery. The input stage is described in more detail below (see FIGS. 7A-7D). The buck-boost stage 120 is a forward-boost/reverse-buck converter that generates a clean folded sine waveform. The buck-boost stage 120 includes an inductor $L_1$ connected to $V_{in}$, a first low side switch Q1 connected between $L_1$ and ground, and a second switch Q2 connected between $L_1$ and the unfolding stage 160. The gate of the transistor in the first switch Q1 and the second switch may be connected to a gate driver (not shown).

While the first embodiment is described being used for sine waveforms, persons having ordinary skill in the art will appreciate the embodiments described herein may operate upon arbitrary and complex waveforms, for example, square, triangular, AM modulated, FM modulated, and are not limited to operating upon sine waveforms.

The inductor $L_1$, for example, with a DCJ, may be a 100 μH inductor. The inductor $L_1$ value may be selected in order to (1) achieve a target distortion (lower inductance increases switching frequency and decreases distortion/THD+N), and/or (2) minimize the switching frequency. In general, a lower switching frequency corresponds to lower power consumption.

The switches Q1 and Q2 may be of the same type, which may be the most practical choice for an integrated circuit (IC) implementation, although embodiments with mixed switches may be used. The switches Q1 and Q2 may be, for example, GaN, PMOS, MEMS switches, among other possible switches.

The unfolding stage 160 is referenced to $V_{in}$ instead of GND. The unfolding stage includes a load 165, for example, a capacitor or a piezoelectric cooling jet, and switches Q3, Q4, Q5, and Q6. Therefore, to obtain 0 V differential, the output and input voltages are equal. Increasing the output voltage across the load 165 above the input voltage $V_{in}$ creates the signal amplitude. Polarity of the output waveform may be selected by the configuration of the unfolding stage 160. Consequently, using a 2-switch boost converter topology of the buck-boost stage 120 as power stage is sufficient since the input voltage only needs to be stepped up.

Bi-directional operation of the buck-boost stage 120 allows energy efficient control of the capacitive load 165. A full-bridge configuration is referenced to the input voltage ($V_{in}$) of the input stage 110 instead of ground, and unfolds the signal into a sinusoidal waveform across the load 165 of the unfolding stage 160.

The maximum output voltage may have a value of $V_{in}+V_p$, where $V_p$ is the differential output signal amplitude. That voltage overhead $V_{in}$ has limited effect on system efficiency.

The current passing through the load returns to $V_{in}$, not to GND. Thus, no direct power dissipation is linked to the voltage overhead. Nevertheless, there may be a small penalty due to the slightly lower efficiency of the converter 100 at a higher conversion ratio.

Given that the power processed by the converter 100 of the first embodiment is on the order of 100 mW with output voltage beyond 50 V, both DC and switching losses are important. Operating the converter 100 in borderline conduction mode (BCM) provides a good trade-off to minimize both. In this mode, the current flowing through the inductor $L_1$ returns back to zero at the end of a switching cycle and then starts to ramp up immediately for the next cycle. Compared to continuous conduction mode (CCM), BCM provides the opportunity for zero voltage, switching (ZVS) thereby reducing switching losses ($\propto fCV^2$) where f is the switching frequency, C is the parasitic capacitance at the switching node and V is the voltage difference between the minimum and maximum voltage value at the switching node. Compared to discontinuous conduction mode (DCM), the first embodiment 100 offers lower root mean square (RMS) current thereby reducing DC losses ($\propto I_{rms}^2 R$), where $I_{rms}$ is the root-mean-squared current and R the resistance in the current path.

The following describes BCM and its limitations in converters with high conversion ratio as per the first embodiment 100. In this case, the conversion ratio goes up to 14.9 for a 50 Vac output from a 3.6 V input. In FIG. 18A a typical waveform of the converter 100 operating in boost mode is presented. First, Q1 turns on and the inductor $L_1$ current ramps up linearly. When Q1 turns off, the voltage at the switching node increases to the output voltage value. Here, the body diode of Q2 turns on and charges the output. When the inductor $L_1$ current reaches 0, the diode turns off and the switching node voltage $V_{SW}$ starts to oscillate. In the first embodiment 100, since the boost converter voltage gain is most of the time larger than 2, $V_{SW}$ decreases to a little bit less than 0 and turns on the body diode of Q1. Thereupon, Q1 turns on again under zero voltage switching condition (ZVS), thus reducing the switching losses associated to the parasitic capacitance at the switching node.

Figure 18B:
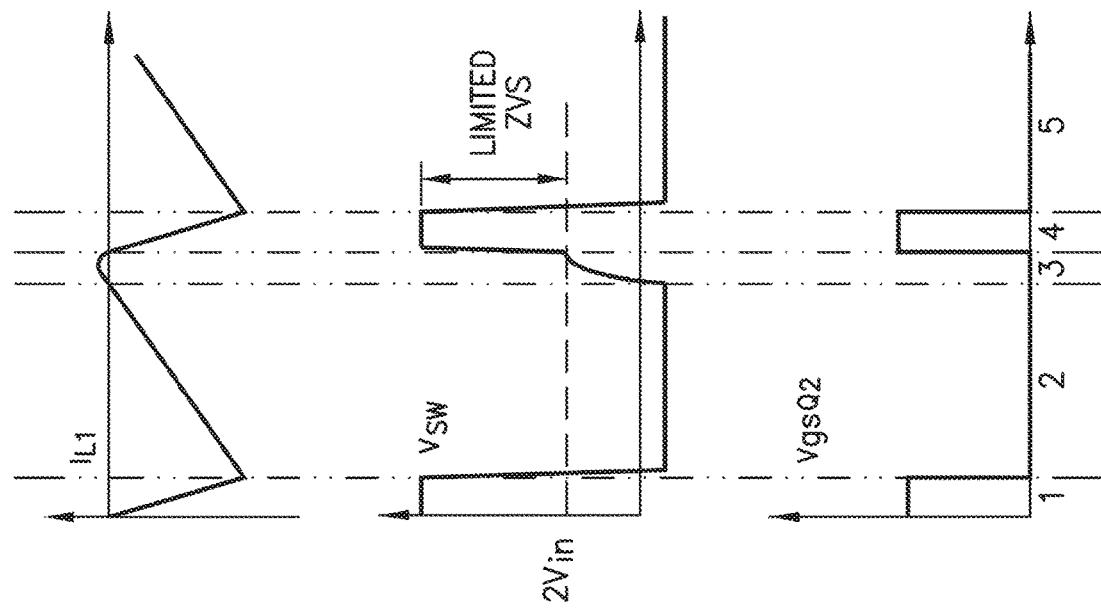
FIG. 18B is a plot diagram of waveforms of the converter of FIG. 1 in regular buck mode.
Figure 18A:
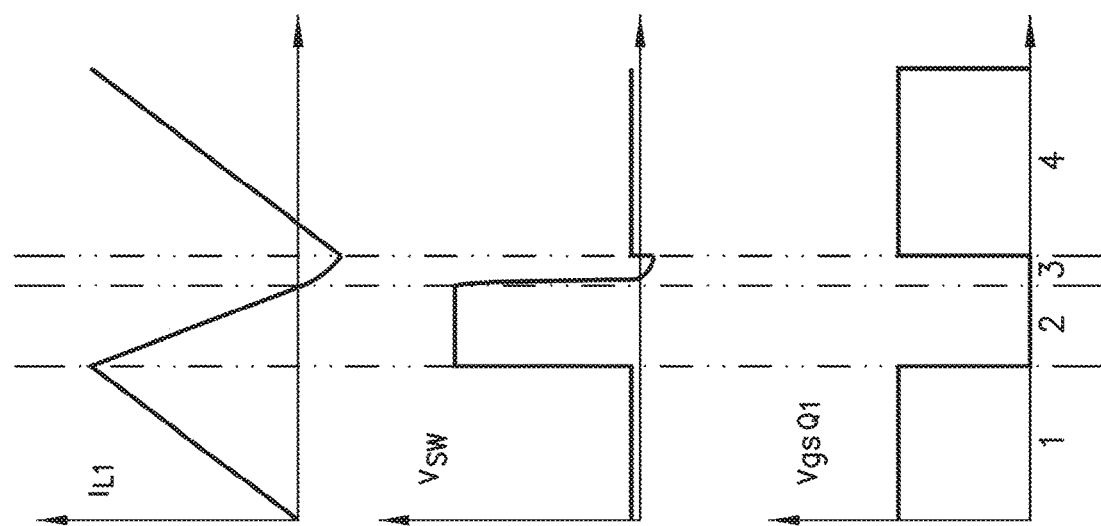
FIG. 18A is a plot diagram of waveforms of the converter of FIG. 1 in boost mode.

FIG. 18B shows a similar case for the buck mode. Switch Q2 turns on and $V_{SW}$ equals the output voltage while the inductor $L_1$ current magnitude increases. When Q2 turns off, $V_{SW}$ goes to GND and Q1 body diode turns on. In this case, the diode voltage drop creates non-negligible DC losses due to low $V_{in}$. When the inductor current reaches 0, the LC tank starts an oscillation. In this case the L is L1 and C is the sum of all parasitic capacitance at the node switch. $V_{SW}$ reaches a maximum at about 2 $V_{in}$ at which point Q2 turns on for the next cycle. The considerable difference between the output voltage and $V_{in}$ limits the power saving of that switching mechanism in buck mode.

When the buck-boost stage 120 is performing a buck operation, it is referred to herein as the buck converter 120. Operating the buck converter 120 as a pseudo resonant synchronous buck converter improves its general efficiency by virtually eliminating switching losses due to the SW node capacitance and reducing DC losses due to diode voltage drop. In this mode, the two switches are used in the buck mode. When Q2 turns off, Q1 turns on in ZVS condition. Instead of going through the diode, the inductor $L_1$ current goes through Q1 which reduces DC losses. Then Q1 stays on until the inductor accumulates enough energy to charge $V_{SW}$ to $V_{out}$. When Q1 turns off, $V_{SW}$ rings to $V_{out}$ and Q2 is turned on under ZVS condition thus reducing switching losses.

Alternative circuit blocks shown in FIGS. 2A-2D and described below may boost a voltage ratio between the output and input voltage in excess of 10:1 and may achieve a distortion level lower than 1% while being very efficient at a low power output. Implementing the topology as a discrete part for a piezoelectric driver may involve practical challenges due to size and cost constraints, but integrating the topology may not be straightforward as most CMOS processes do not accommodate efficient bi-directional operation of the converter due to process limitations.

While the topology used in the alternative embodiments of FIGS. 2A-2D have similarities to the circuit of FIG. 1, the topology may be implemented in a single integrated circuit (generally excepting inductor L) with significantly lower distortion and high power efficiency for driving a capacitive load such as a piezoelectric actuator. This is an important step forward to enable a variety of new applications.

The alternative embodiments of FIGS. 2A-2D use a two-switch power converter cell as a bi-directional driver to control a capacitive load with low distortion analog waveforms. To achieve the desired performance level, the 2-switch power converter is designed to ensure that the switching frequency is high enough to allow the output waveform to reach the low-distortion level targeted. The frequency required can be estimated by:

$$\text{Resolution} = \log_2 \frac{f_{sw}}{2 * f_{sig}} \quad \text{(Eq. 1)}$$

where $f_{sw}$, is the converter switching frequency and $f_{sig}$ is the frequency of the output signal. By standard analog theory, the resolution can be linked to an ideal distortion level.

FIGS. 2A-2D depict four examples of alternative embodiments of two-switch power converters that may be used to directly generate the output waveform to control a capacitive load. FIG. 2A is a circuit diagram depicting a driver topology for a 2-switch buck-boost converter 221. The 2-switch buck-boost converter 221 does not require a transformer or coupled inductor and may be used directly to drive a unipolar signal (always above 0) on the load. FIG. 2B is a circuit diagram depicting a driver topology for a 2-switch tapped inductor buck-boost converter 222. FIG. 2C is a circuit diagram depicting a driver topology for a 2-switch flyback buck-boost converter 223. FIG. 2D is a circuit diagram depicting a driver topology for a 2-switch flyback buck-boost low side secondary switch converter 223. FIGS. 2B, 2C and 2D use the same principle as FIG. 2A. They may be preferable to 2A when the output voltage is higher as they may achieve lower power. The choice of the implementation depends upon the exact requirements for the application (e.g. size, power, fabrication process). The alternative converters 221-224 demonstrate that a capacitive load requiring low distortion analog waveform may be driven directly from a 2-switch bi-directional converter. The exact topology chosen may be application specific. The converter 221 may use synchronous switching, regular switching, or a combination of both to achieve the best performance for the application.

FIGS. 3A-3E present different configurations 301-305 of the unfolding stage 160 (FIG. 1), or output stage, that may be used for different driver embodiments to interface with the capacitive load 365. A standard full-bridge configuration 301 is presented in FIG. 3A, which is similar to the unfolding stage 160 (FIG. 1). The configuration 301 includes a load 365, for example, a capacitor or an actuator, and switches Q3, Q4, Q5, and Q6. This configuration enables doubling the effective output voltage signal on the load 365, that translates for an actuator as approximately 2 times more displacement. The full-bridge may be a reference to the input voltage to be used with a power converter such as a 2-switch buck-boost (FIG. 2A). FIG. 3B shows a full-bridge output 302 with discrete voltage reference choice. FIG. 3C shows a full-bridge output stage 303 with analog variable reference $V_{ref}$. FIG. 3D shows an output stage 304 with the load 365 connected to a discrete variable reference, whereas FIG. 3E shows an output stage 305 with the load 365 connected to a variable analog reference $V_{ref}$.

If the first stage is a 2-switch flyback configuration 223 (FIG. 2C), 224 (FIG. 2D), the full bridge may be referenced to GND, as shown by the converter 303 of FIG. 3B. In other cases, a full bridge converter 304 with discrete variable reference (FIG. 3C), enables higher power delivery efficiency. Note that while depicted with two alternative reference points (GND and yin on FIG. 3B), the illustrated concepts may be expanded to an arbitrary number of discrete reference points. In a very low distortion application, a full bridge with variable analog reference may reduce distortion and improve converter stage efficiency. If a unipolar output is desired, the same approach may be used with the same advantages as shown in FIGS. 3D and 3E. For the converter output stage 303 shown in FIG. 3C and the output stage 305 shown in FIG. 3E, the triangle symbol represents an amplifier to which one may feed a variable input $V_{ref}$ and control that side of the load 365.

Combining the circuits of FIGS. 3B and 3C or FIGS. 3D and 3E provides for smoothing out the transition between the particular reference voltages while enabling higher power efficiency because the variable analog reference, which is less efficient than a simple switch, may be active only during the transition. Such combinations may provide the lower distortion advantage of the analog reference while retaining most of the power advantage of the discrete reference approach.

Under the above described embodiments, the folded waveform is depicted as a "half" waveform (sine wave) and that is unfolded into a full waveform by an unfolding output stage 160. However, in some scenarios a better approach is directly applying the circuit of FIG. 2A with no output stage from FIGS. 3A-3E, where the driver generates the full waveform. Therefore, while there may be scenarios where the folded waveform may be a half waveform, the embodiments are not intended to be limited to generating a folded (half) waveform.

Figure 4:
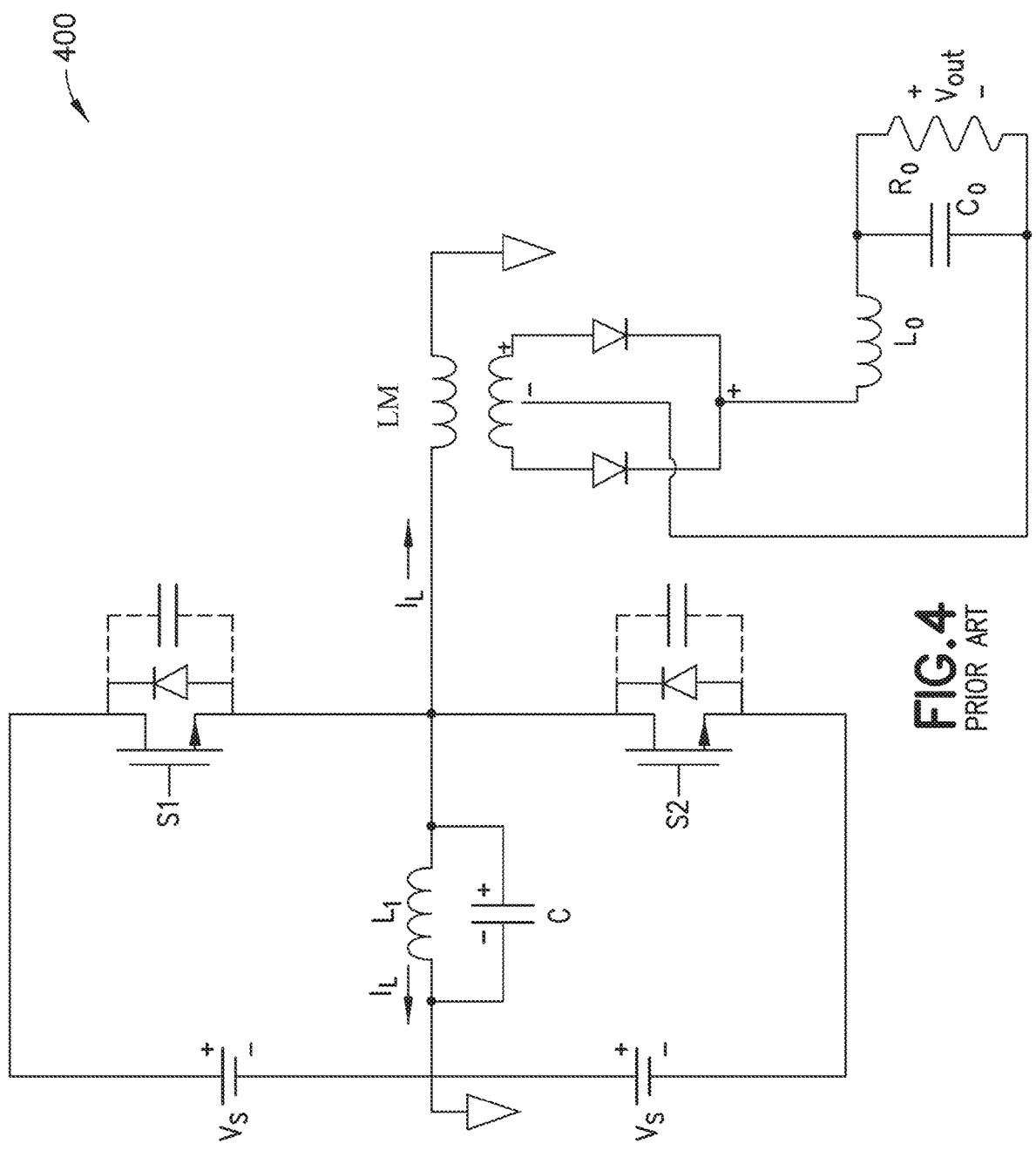
FIG. 4 is a circuit diagram illustrating a prior art pseudo-resonant operation of a power converter.

FIG. 4 shows a pseudo-resonant operation of a power converter 400 that was first proposed in 1991 to reduce switching losses in high frequency converters. The design is based on knowledge of the fixed input and output condition and the inclusion of a resonant network composed of an inductor and capacitor.

Figure 5:
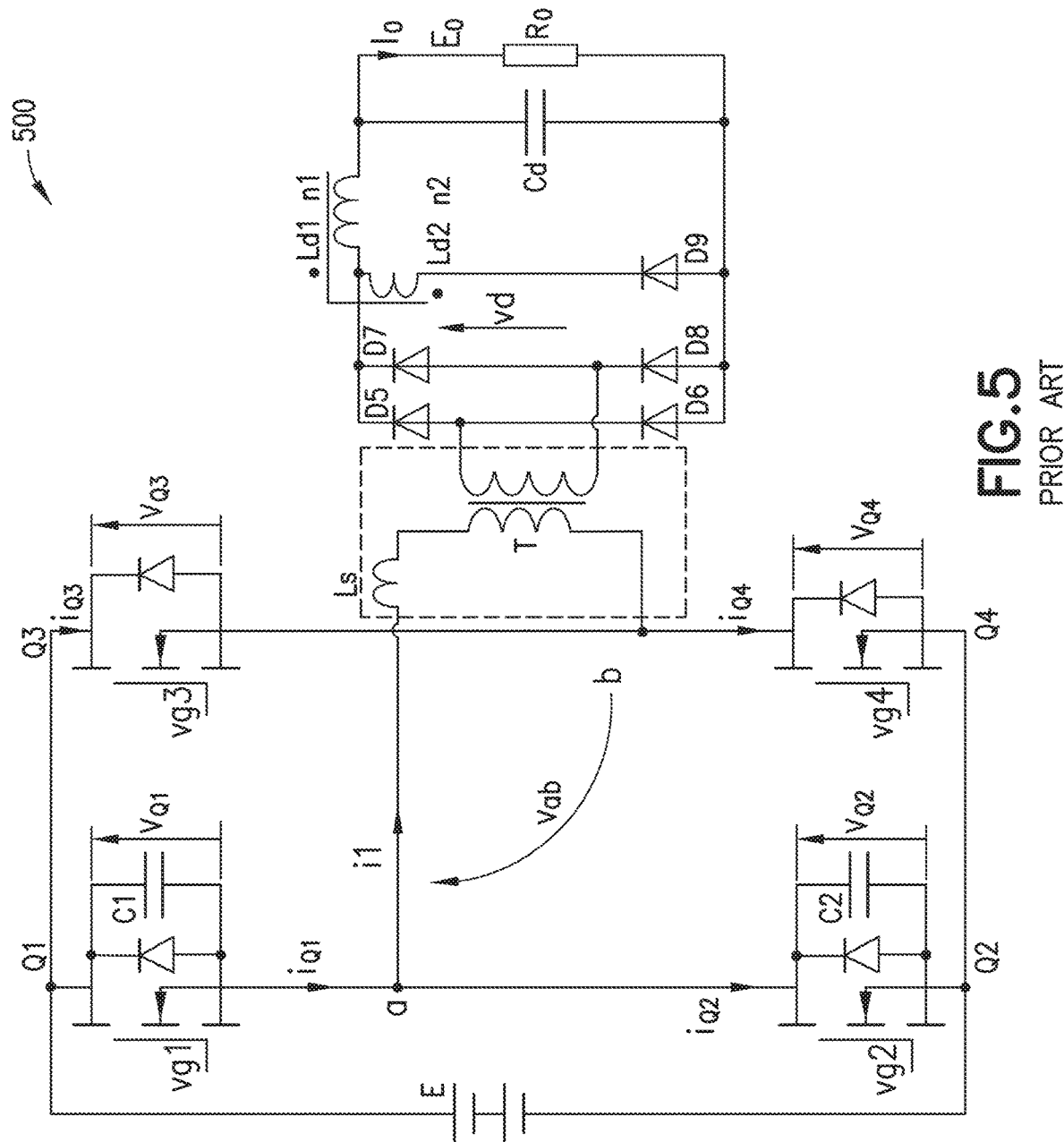
FIG. 5 is a circuit diagram illustrating a more recent prior art pseudo-resonant operation of a power converter using similar principals to the circuit of FIG. 4.
Figure 7:
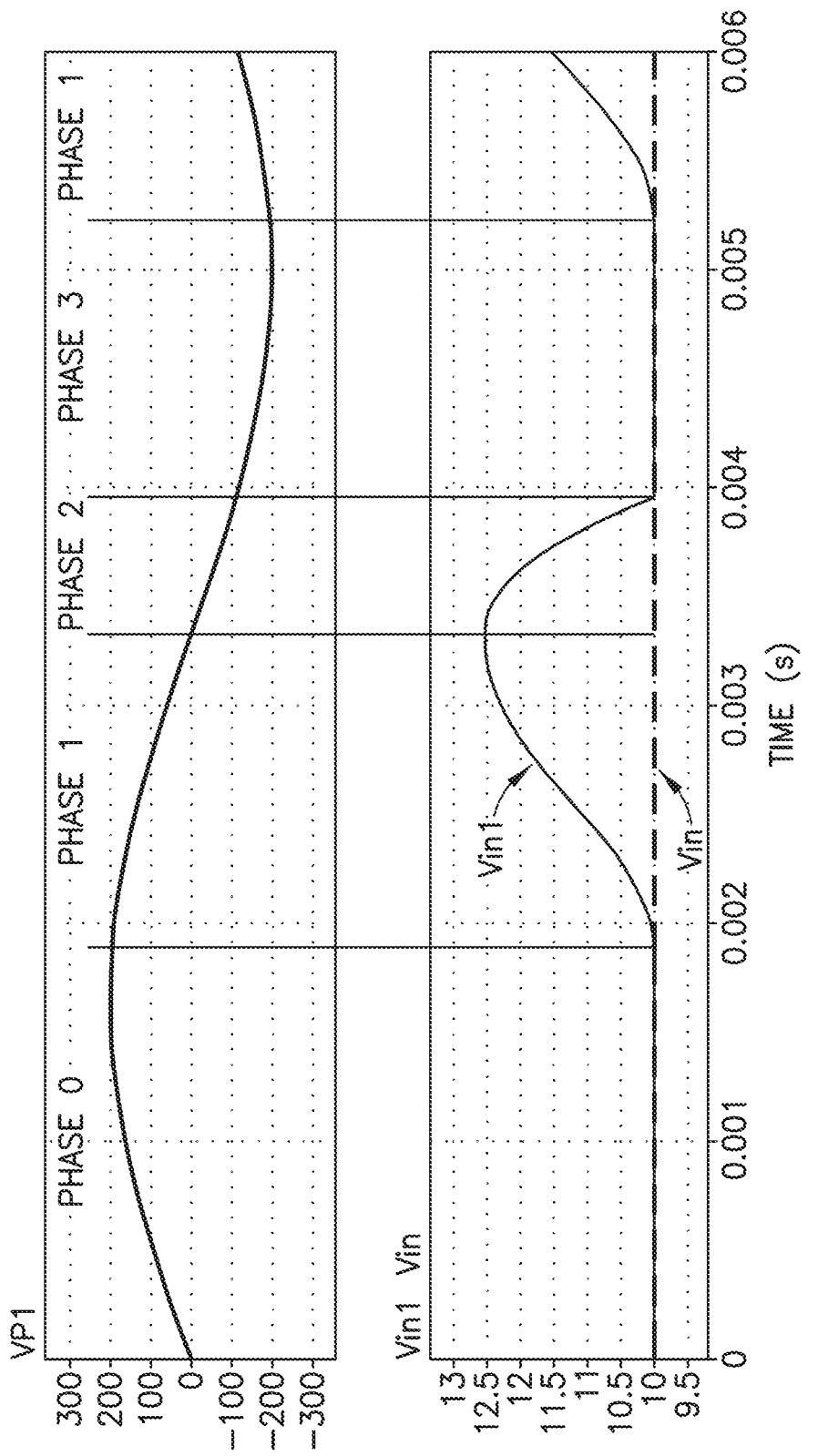
FIG. 7 shows two voltage plots illustrating the effect of supplying a bi-directional converter with a unidirectional power input.

FIG. 5 shows an implementation of a circuit 500 using similar principals to the circuit of FIG. 4. Here again, the implementation includes passive components to achieve the benefit. High voltage capacitors C1 and C2 are included in the circuit thus increasing cost and size of the solution. Moreover, this implementation is a DC/DC converter so the input/output voltage relationship is static, thus simplifying the problem.

Compared with previous circuits, for example, as shown by FIG. 19, the first embodiment 100 (FIG. 1) may operate in pseudo-resonant mode without adding any dedicated reactive (inductive (L) or capacitive (C)) components. This provides the benefit of pseudo-resonant operation without use of additional components. The pseudo-resonant operation constantly monitors the output voltage. The output voltage is used to compute the current required in a first low-side switch Q1 pulse to achieve pseudo-resonant charging of the switching node up to the output voltage. Moreover, because the output/input relationship is constantly changing, the controller dynamically adapts the current required in Q1 at each switching cycle to the present operating conditions. Since at some point the converter needs to process levels of power that are below its capability, the pseudo-resonant implementation recognizes discontinuous conduction mode (DCM) and turns off Q1 in zero current switching (ZCS) mode to finish the synchronous switching cycle, without losing extra energy in the circuit. When the converter is in DCM and a new pulse is required to transfer energy, the circuit resumes first by turning on Q1 to generate a pseudo-resonant pulse and avoid high switching losses from hard switching a second switch Q2.

Although bi-directional operation of a power converter is used in many applications, single die bi-directional converters are not practical in standard CMOS technology due to parasitic transistors formed when current is flowing in the reverse direction. To solve that issue, the first embodiment driver 100 may be implemented using a Silicon on Insulator (SOI) technology. This enables the driver to have all its switches Q1-Q6 implemented on a single die which reduces size and cost of the solution.

A bi-directional converter transfers power in two directions: input to output, and output to input. When the bi-directional converter is used to drive a capacitive load, it can be assumed that the net flow of energy over a waveform period (where output starts and finishes at the same voltage level) may be from the input to the output due to the law of energy conservation. Losses in the system make it inevitable that more energy enters the system than exits the system. Also, in power converters, the general case is that the closer the voltage conversion ratio is to unity, the higher the conversion efficiency may be due to lower losses.

Providing a unidirectional power input to a bi-directional converter causes the following to happen. First, power is drawn from the input source when the power converter is in forward mode (input to output). Second, energy recovered accumulates on the input energy storage device, for instance a capacitor, when in reverse mode (output to input).

Energy accumulation on a capacitor causes input voltage to increase, thus lowering the voltage conversion ratio and leading to higher overall power efficiency. This is illustrated by voltage plots in FIG. 7. $V_{P1}$ (top graph) is the differential voltage across a load, $V_{in}$ (bottom graph) is the input voltage of the system, and $V_{in}1$ is the voltage at the input of the bi-directional converter. In phase 0, $V_{in}1$ sits at the same value as $V_{in}$ when the converter operates in forward mode for the first time. In phase 1, the converter changes to reverse mode. The energy recovered accumulates on the bi-directional converter input energy storage device. Consequently, yin increases. When the converter changes back to the forward mode in phase 2, it starts by consuming the energy accumulated on C1 (no current flows from yin in this phase). When $V_{in}1$ reaches $V_{in}$, the converter starts to use energy from yin again (Phase 3). Phases 1, 2, and 3 repeat themselves as long as the converter operates. Power savings are realized in two ways. First, during phases 2 and 3 the voltage conversion ratio is reduced yielding higher efficiency. Second, the RMS current ($I_{rms}$) flowing to/from $V_{in}$ is reduced thus DC losses ($\propto I_{rms}^2 R$) where R is the parasitic resistance of the current path between $V_{in}$ and $V_{in1}$.

The exact voltage increase can be adjusted by first calculating the maximum energy that may be recovered from the load and then sizing the input capacitor (C1) appropriately to achieve the desired voltage increase.

FIGS. 7A-7D illustrate four alternative embodiments of the unidirectional power input. The simplest implementation is a diode D1 as shown in FIG. 6A, having a power source, the diode D1, a capacitor C1, a bi-directional power converter 705, and a load 765. FIG. 6B presents an implementation where losses in the input may be lowered by using an active switch 721 in place of the diode D1. If the switch 721 has the ability to allow current in both directions, then the reverse conduction capability may be used to also recover the energy stored in the capacitor C1 when the converter prepares to shut down. FIG. 6C shows that, more generally, any power converter, for example, a unidirectional power converter 735, may be used. The potential advantage of including a unidirectional power converter 735 is that it can increase the base value of Vail above yin. That voltage increase enables the main power converter to operate with a lower voltage conversion ratio, thus leading to a better overall efficiency. Charge pumps and inductor based converters are examples of possible power input stages. The optimal implementation depends on the application. Similar to FIG. 6B, FIG. 6D presents the use of a bi-directional converter 745 for the input. While the driver of FIG. 6D has bi-directional capability, its reverse power transfer capability may only be used when the main converter is about to shut down to recover the energy available on the capacitor C1. The reverse power capability can also be used in case of an overvoltage situation is detected on the capacitor C1 to prevent circuit failure.

In a typical step-up converter, the output device for example switch Q2 (FIG. 1) is preferably a discrete part or on a different die to avoid triggering parasitic transistors in standard CMOS processes. Triggering of these parasitic devices significantly reduces the amount of energy transferred from the input to the output because a significant amount of the energy is connected to the substrate through these parasitic paths. Presently, integrating a single forward diode in the converter is unconventional and a highlighted feature in data sheets.

In the topology of FIG. 1, there may be up to five problematic devices, in particular Q2, which acts as the output diode in any boost converter arrangement, but also Q3-Q6 when the converter transfers energy from the output to the input. To solve this issue, the first embodiment may employ a Silicon on Insulator CMOS technology. That technology removes the parasitic devices, thus enabling the full integration or nearly full integration of the driver.

The use of a full-bridge (Q3, Q4, Q5, Q6) for a low-cost highly integrated IC may be a problem as the four switches are not referenced to GND which increases the area, size and power required to control them. In response, SOI technology capabilities may be leveraged. FIG. 4 shows a low-voltage supply that sits on top of the $V_{in}$ voltage level. By using a charge pump, an output voltage of twice the input voltage may be produced. However, twice the input voltage puts excessive voltage stress on the transistor. To solve the problem, a full-bridge driver is referenced to $V_{in}$ instead of gnd. Consequently, the voltage across the full-bridge driver devices becomes $V_{in}$, the normal operating voltage.

Figure 9:
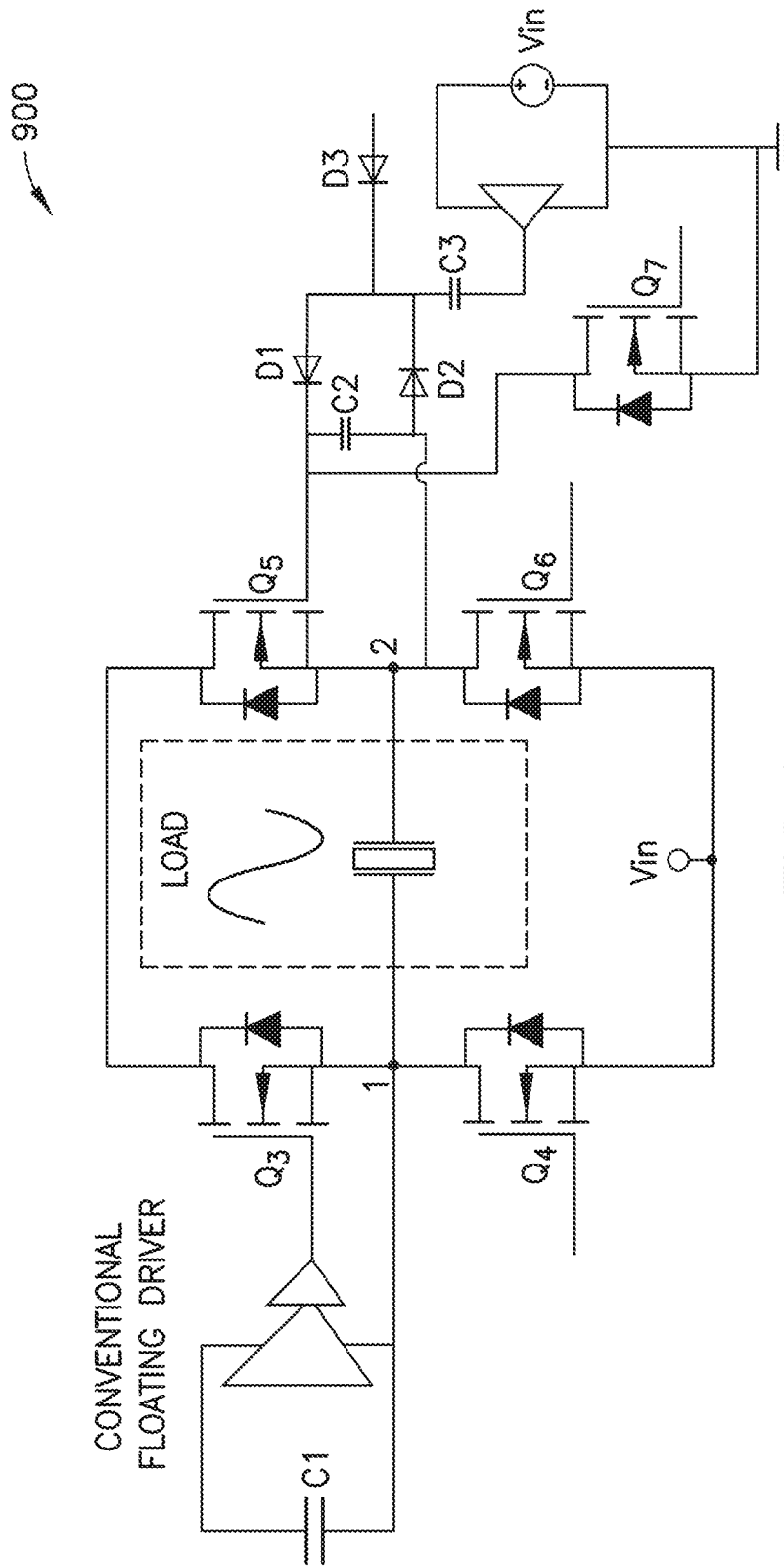
FIG. 9 is a circuit diagram of a driver circuit embodiment having a common high-side gate driver vs a new driver.

The circuit 800 of FIG. 8 only solves the problem to drive Q4 and Q6 which are referenced to Vin. For Q3 and Q5 a different circuit may be used. A common implementation 900 is shown in FIG. 9 driving Q3. Here, driving Q3 uses a very large capacitor, for example, 10 s nF C1 to store enough energy to be able to supply the driver controlling Q3 while the source voltage of Q3 is high. Once the source voltage of Q3 goes low again, the capacitor C1 can be recharged in preparation for the next cycle. That approach may not work for a highly integrated solution as C1 may not be integrated on chip due to its high capacitance. Also, that approach needs the designer to guarantee a certain refresh rate of C1 to be able to ensure that the driver works properly. That means a high voltage cannot be held for long.

The circuit 900 of FIG. 9 addresses these problems. When node 2 is low ($=V_{in}$) Q5 gate may be activated by charging C2 through D3. D3 is connected to the gate of Q4. This charging path is not essential, but enables Q5 to turn on faster. Then when node 2 starts to go higher, charges on C2 may be refreshed to counteract the current associated to the parasitic capacitance of Q5 and leakage paths. To do so, the combination of D1, D2 and C3 acts as a charge pump keeping the gate of Q5 approximately Vin V higher than its source. To turn off Q5, switch Q7 is turned on. All the components depicted here may be very small because very little charge needs to be replaced on C2. For example, capacitors are in the pF range and the diodes are very small since very little power is needed. Also, this arrangement makes it possible to process arbitrary waveforms without imposing any refresh rate constraint for the user. This full-bridge driver, makes possible the integration of a full-bridge on die with very little driver area overhead.

Figure 11:
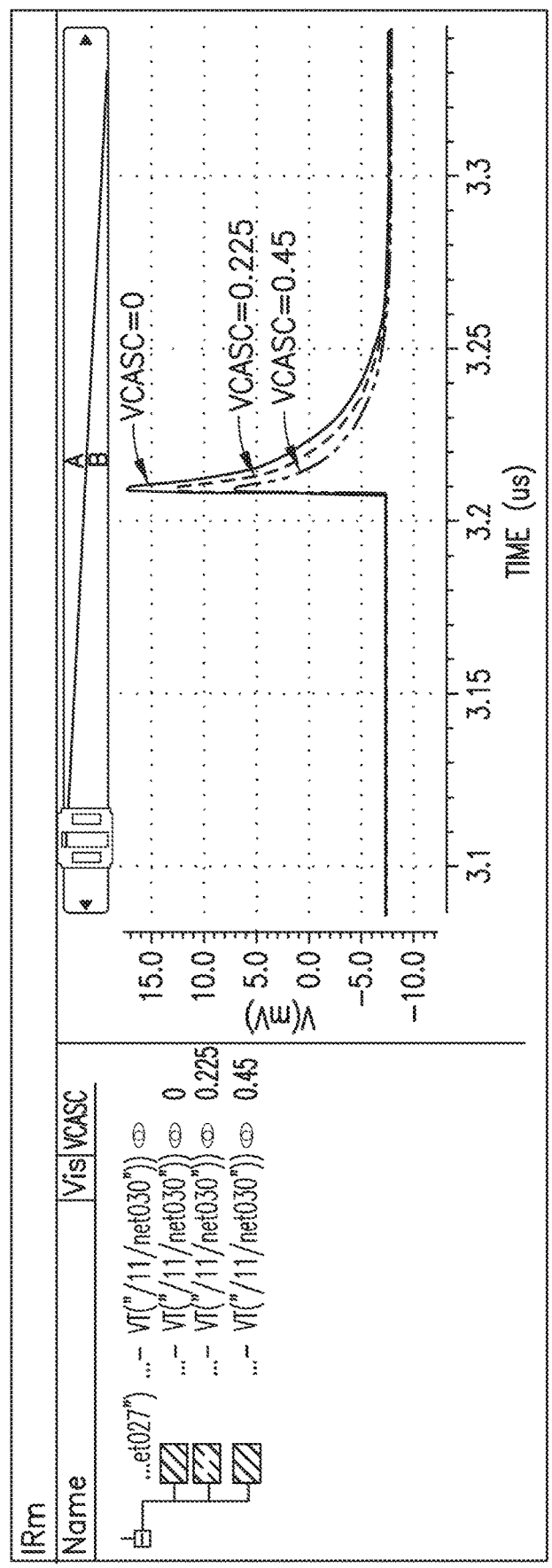
FIG. 11 is a plot showing the effect of decreasing the voltage difference between the DAC output and alternated path.

Typically, current digital to analog converters (DAC) have an alternate current path connected to the supply voltage, as per the circuit 1010 of FIG. 10A. However, when the DAC value changes, the parasitic capacitance of each bit line takes longer to settle due to the large variation in voltage between node 1 and node 2. To improve that, both current paths are connected through a pair of cascode devices biased at the appropriate voltage Vbias, as shown by the circuit 1020 of FIG. 10B. This reduces the time between a change of DAC value and the time the output of the DAC settles to the new value. FIG. 11 shows simulated results. The Vcasc=0.45 result is when the alternate current path is connected to a voltage source at a voltage level similar to the output.

FIG. 11 represents the effect of decreasing the voltage difference between the DAC output and alternated path. When difference is smaller transient voltage is smaller and settling is faster. Under the present embodiments this enables the circuit to use a smaller blanking time for current detection. As used herein, "blanking time" refers to the finite amount of time before the reference settles to the desired value when a change in the current value is detected. During the blanking time, the sensor output may be deactivated to avoid false triggering. On a higher level, this enables more accurate current detection and lower output distortion of the final waveform.

In general, current control may be achieved through a series resistor with an inductor, a parallel RC circuit or senseFet in parallel to each switch. In such a driver, high precision current sensing is desirable to operate in a synchronous mode, as switches should be turned off at absolute zero current (as opposed to peak current detection that may be automatically corrected by the controller). Use of a parallel RC circuit is not an option because the circuit operates in DCM. The senseFet approach may work for the low side switch (Q1). However, implementing a highly accurate senseFet for the switch Q2 is difficult due to the large voltage swings of Q2. Also, to avoid having to create a high side ZVS detection circuit for Q2 ZVS, a series resistance provides good current sensing ability even when both switches are off. That enables detecting the ideal point to turn on Q2 without an additional circuit.

The current sense circuit used in the present embodiments preferably detects up to three different events per switching cycle to enable high efficiency of the converter. Regrouping all those events in a single sensor provides for higher sensor power for higher performance, since it replaces three sensors.

Due to wide varying conditions in the converter, the relatively fixed latency of the current sensing circuit means that different offset between the desired switching point and real switching point may occur, which is significant because if the synchronous rectifier turns off at −30 mA instead of 0 mA, the efficiency may be much lower. Accordingly, the controller may calculate a different offset for the current sensing circuit according to the instantaneous conditions, allowing the switch to activate at the correct time.

Figure 12:
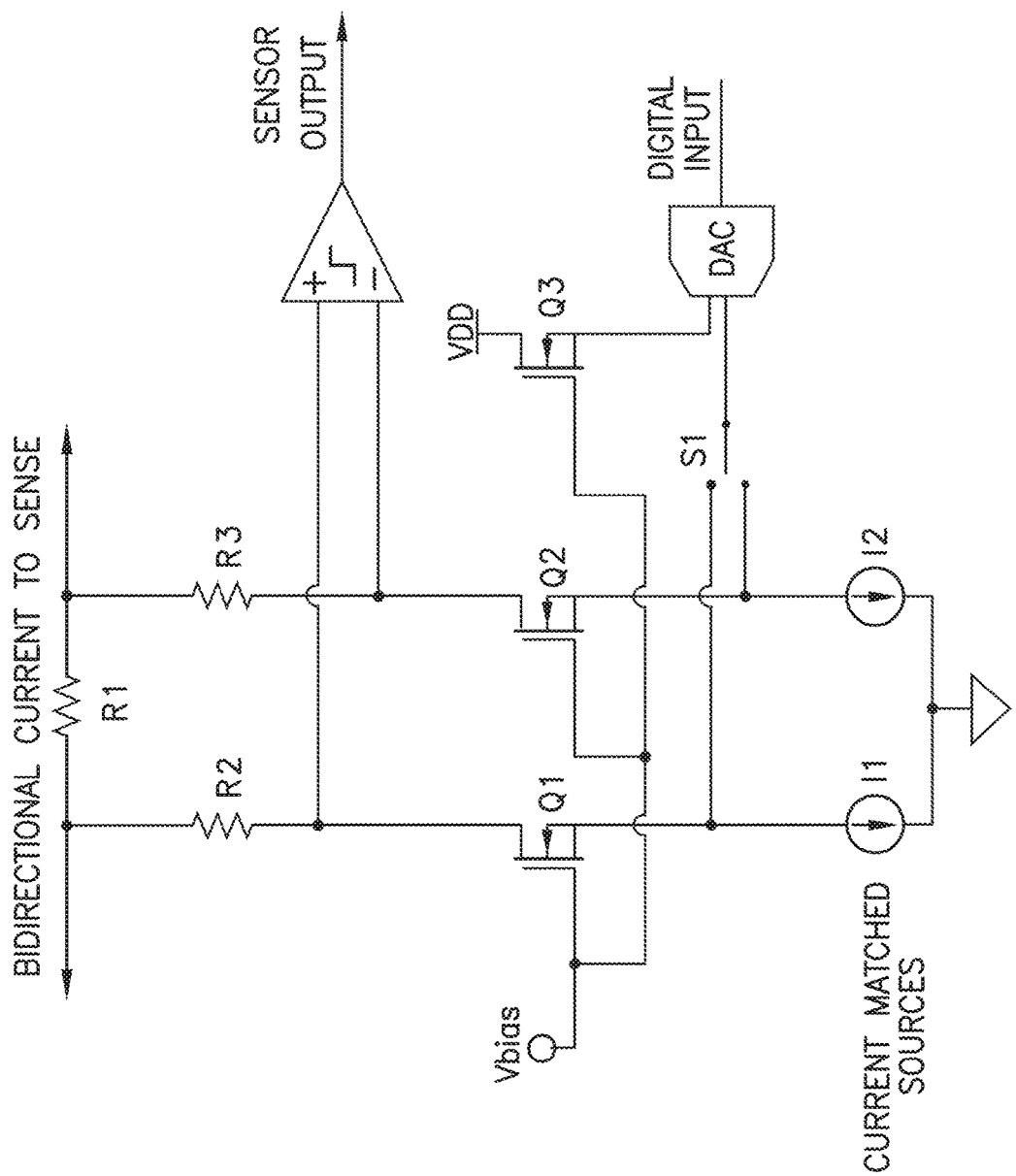
FIG. 12 is a circuit diagram of an exemplary single sensor bi-directional current sensing circuit with the DAC from FIG. 10B.

The combination of the enhanced current DAC previously described with a bi-directional sense scheme allows the reuse of the same DAC and comparator to sense current in both directions. It also enables a one bit increase in the effective DAC resolution at very low area costs. For example, if the DAC is a nine bit DAC, this configuration allows sensing of current from −511 to 511 mA, instead of a range from 0 to 511 in conventional connections. An embodiment of such a circuit is shown in FIG. 12. The sensed target current flows through S1. Depending on S1 configuration, the value of the current is interpreted as a positive or negative value by the circuit. Q1, Q2, and Q3 form the enhanced current DAC described below. The two current sources I1 and I2 are matched (same current) and bias the two inputs of the comparator at the same voltage if the DAC current is 0 and current sensed is also 0. R2 and R3 are matched resistors providing a DC offset to allow bi-directional sensing and also ease the comparator operation. When current flows through R1, the voltage at the inputs of the comparator changes according to I*R1. Changing the DAC value changes the current required in R1 so that the two inputs of the comparator may return to the same voltage level. Then the comparator fires to indicate that the desired current threshold has been reached.

While transistors are used in the current implementation for power switches, MEMS switches could be used in the future to lower the power path resistance and ease the control of high-side switches. An example of MEMS switches is manufactured by General Electric (2015).

Low distortion is an important performance criterion for piezoelectric actuator drivers. While the power stage design and resolution of the feedback path constrain the distortion level, the control algorithm ensures that the complete solution achieves a superior scenario instead of a higher distortion level. While a fixed PI controller would be adequate because of the wide varying operating conditions, the controller parameters would need to be set to the most conservative setting to ensure stability in all cases. However, this does not adequately reduce distortion. Leveraging the flexibility of a digital controller, the controller designed for drivers under the current embodiment adapts its proportional and integral gain to the instantaneous operating conditions (output/input voltage, frequency), resulting in up to 20 dB improvement of the distortion.

Automatic offset adjustment of the current DAC enables accurate Zero Current Switching at all times. Because the power converter state varies considerably, a fixed latency through the controller does not always produce the same results in terms of switching time accuracy. In one case, trying to turn-off a switch at 0 mA might turn it off at −2 mA while in another set of condition, it can result to a turn-off at −30 mA. That uncertainty creates problems for the controller both in terms of power loss and also quality of the output (distortion). To solve the problem, the controller automatically corrects the target current to an "artificial current target." When the current sensor triggers at that artificial value, the controller turns on/off the intended switch. Because the correction function (f(converter state)) knows the system, the switch that triggered at the "artificial current target" beneficially turns on/off at the intended target current value. Importantly, this enables the ability to turn on the High Side switch (Q2) at the right time to achieve zero voltage switching, leading to lower power, but perhaps more importantly, lower distortion.

Figure 13:
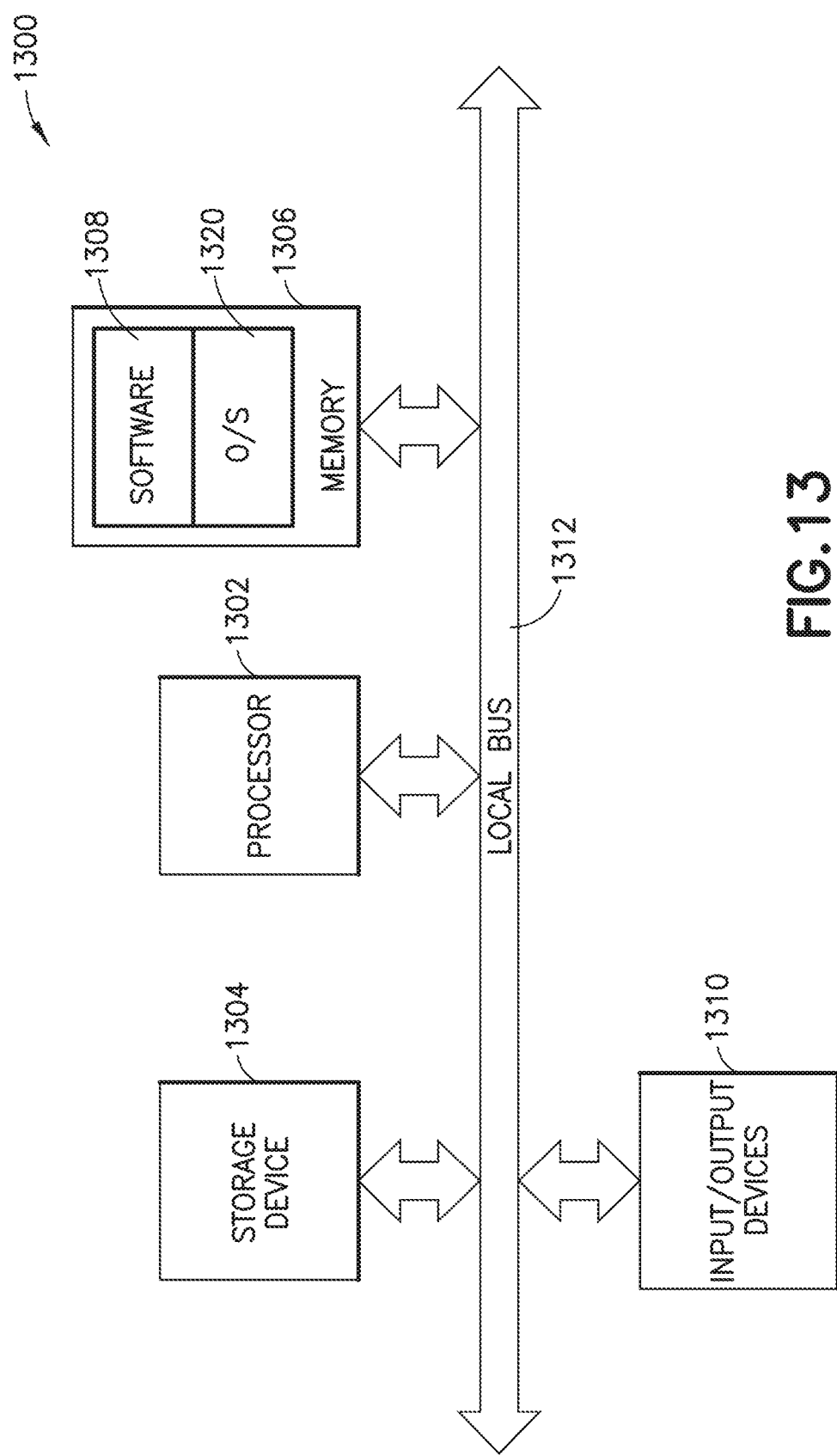
FIG. 13 is a schematic diagram illustrating an example of a controller for the present invention.

A controller 1300 for controlling the driver, for example, a digital controller, may be a computer, an example of which is shown in the schematic diagram of FIG. 13. The controller 1300 contains a processor 1302, a storage device 1304, a memory 1306 having software 1308 stored therein that defines the abovementioned functionality, input and output (I/O) devices 1310 (or peripherals), and a local bus, or local interface 1312 allowing for communication within the controller. The local interface 1312 can be, for example but not limited to, one or more buses or other wired or wireless connections, as is known in the art. The local interface 1312 may have additional elements, which are omitted for simplicity, such as controllers, buffers (caches), drivers, repeaters, and receivers, to enable communications. Further, the local interface 1312 may include address, control, and/or data connections to enable appropriate communications among the aforementioned components.

The processor 1302 is a hardware device for executing software, particularly that stored in the memory 1306. The processor 1302 can be any custom made or commercially available single core or multi-core processor, a central processing unit (CPU), an auxiliary processor among several processors associated with the present controller 1300, a semiconductor based microprocessor (in the form of a microchip or chip set), a macroprocessor, or generally any device for executing software instructions.

The memory 1306 can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 1306 may incorporate electronic, magnetic, optical, and/or other types of storage media. Note that the memory 1306 can have a distributed architecture, where various components are situated remotely from one another, but can be accessed by the processor 1302.

The software 1308 defines functionality performed by the controller 1300, in accordance with the present invention. The software 1308 in the memory 1306 may include one or more separate programs, each of which contains an ordered listing of executable instructions for implementing logical functions of the controller 1300, as described below. The memory 1306 may contain an operating system (O/S) 1320. The operating system essentially controls the execution of programs within the controller 1300 and provides scheduling, input-output control, file and data management, memory management, and communication control and related services.

The I/O devices 1310 may include input devices, for example but not limited to, a keyboard, mouse, scanner, microphone, etc. Furthermore, the I/O devices 1310 may also include output devices, for example but not limited to, a printer, display, etc. Finally, the I/O devices 1310 may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the controller is in operation, the processor 1302 is configured to execute the software 1308 stored within the memory 1306, to communicate data to and from the memory 1306, and to generally control operations of the controller pursuant to the software 1308, as explained above.

When the functionality of the controller is in operation, the processor 1302 is configured to execute the software 1308 stored within the memory 1306, to communicate data to and from the memory 1306, and to generally control operations of the controller pursuant to the software 1308. The operating system 1320 is read by the processor 1302, perhaps buffered within the processor 1302, and then executed.

When the controller is implemented in software 1308, it should be noted that instructions for implementing the controller can be stored on any computer-readable medium for use by or in connection with any computer-related device, system, or method. Such a computer-readable medium may, in some embodiments, correspond to either or both the memory 1306 or the storage device 1304. In the context of this document, a computer-readable medium is an electronic, magnetic, optical, or other physical device or means that can contain or store a computer program for use by or in connection with a computer-related device, system, or method. Instructions for implementing the system can be embodied in any computer-readable medium for use by or in connection with the processor or other such instruction execution system, apparatus, or device. Although the processor 1302 has been mentioned by way of example, such instruction execution system, apparatus, or device may, in some embodiments, be any computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the processor or other such instruction execution system, apparatus, or device.

Such a computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the controller is implemented in hardware, the controller can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

As used within this disclosure, a proportional-integral-derivative controller (PID controller) describes a control loop feedback mechanism (controller). A PID controller continuously calculates an error as the difference between a desired setpoint and a measured process variable. The controller attempts to minimize the error over time by adjustment of a control variable, such as the position of an actuator, to a new value determined by a weighted sum. The proportional response may be adjusted by multiplying the error by a constant proportional gain (Kp).

Figure 14A:
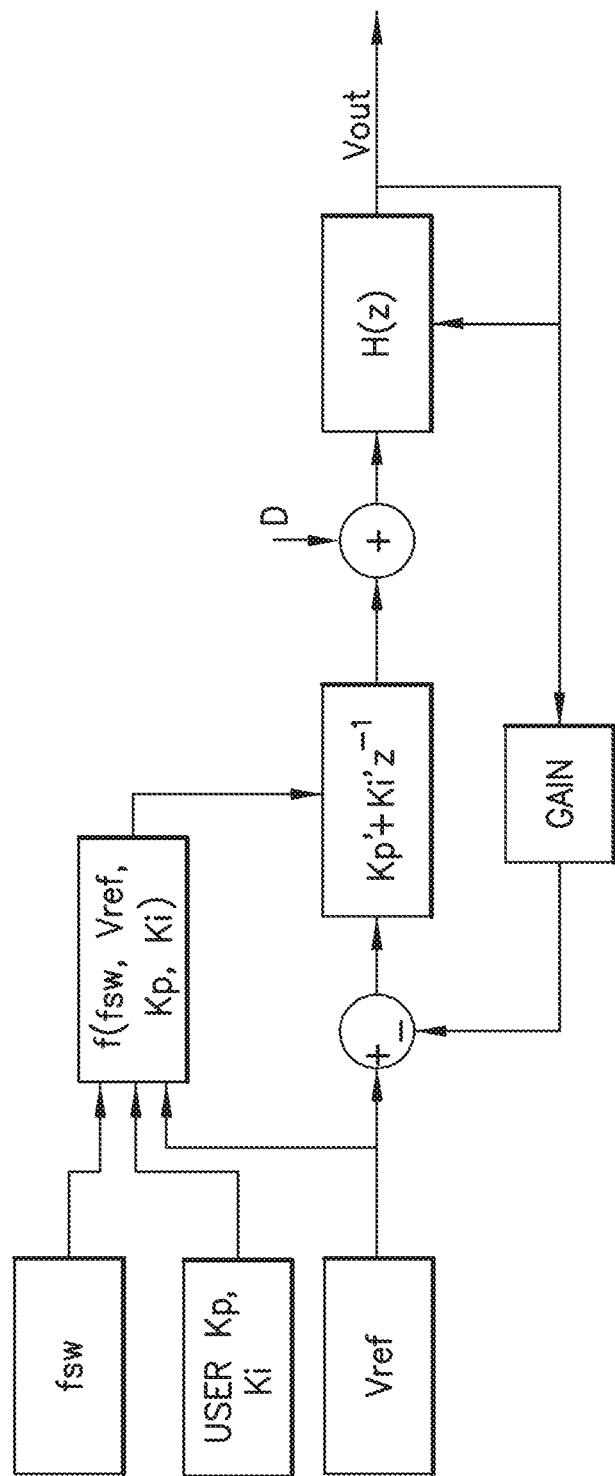
FIG. 14A is a schematic block diagram of an exemplary embodiment for a driver controller.
Figure 14B:
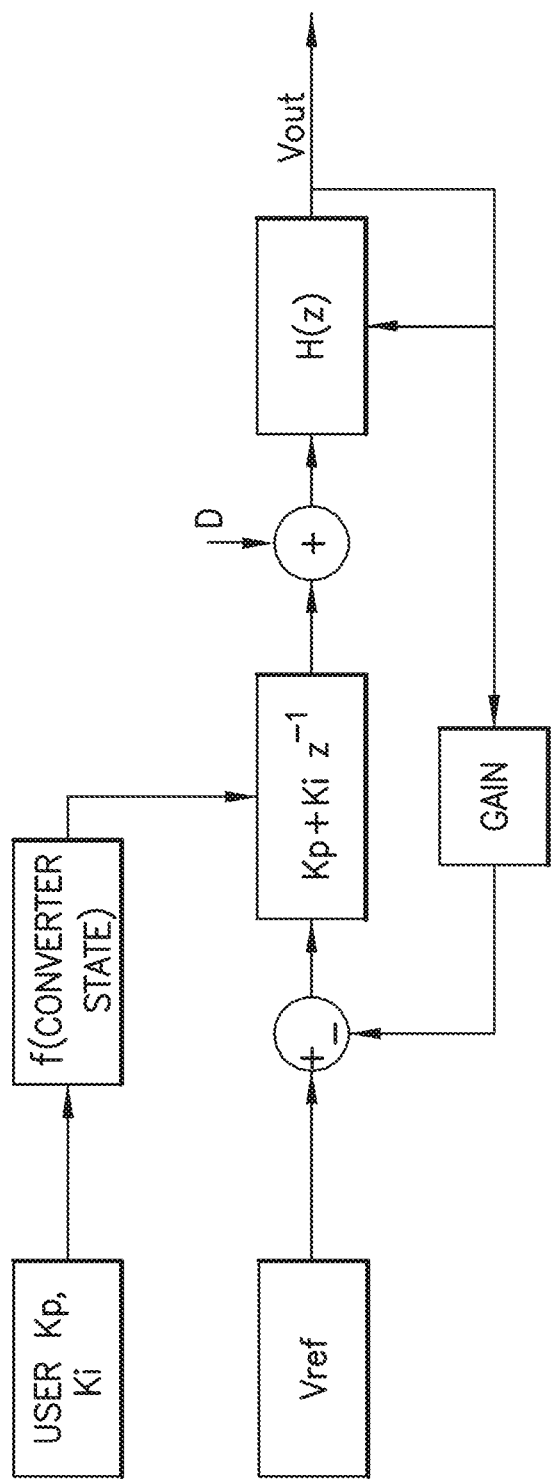
FIG. 14B is a schematic diagram of an exemplary control configuration.

FIGS. 14A and 14B are two block diagrams of exemplary embodiments 1410, 1420 of control drivers, providing compact, low-power, low-noise piezoelectric cooling. In these embodiments the controllers 1410, 1420 use information available through different state variables inside the digital controller on the current state of the driver to adapt the proportional gain Kp and an integral gain (Ki) of the controller. As a result, the waveform distortion is reduced. FIG. 14A is more specific. FIG. 14B is more general to illustrate how the scaling of Kp and Ki according to a function of the driver state variables enhances the system performance. FIGS. 14A and 14B, indicate the converter switching frequency (fsw), the voltage reference to track (Vref), the proportional gain (Kp), the integral gain (Ki), the converter transfer function (H(z)), an external disturbance (D), feedback gain (Gain), and output voltage of the converter (Vout). In the simplest embodiment, Kp may be scaled linearly with the output voltage (Kp'∝Vout×Kp) and Ki may be scaled linearly with the switching frequency (fsw) (Ki'∝fsw×Ki). D represents any disturbance that could exist in a practical implementation. H(z) represents the transfer function of the system in a discrete-time representation. $z^{-1}$ is an operator associated with the z-transform commonly used in controllers using discrete-time representation. In the exemplary embodiment, fsw is in the range between 150 kHz and 1 MHz.

Figure 15:
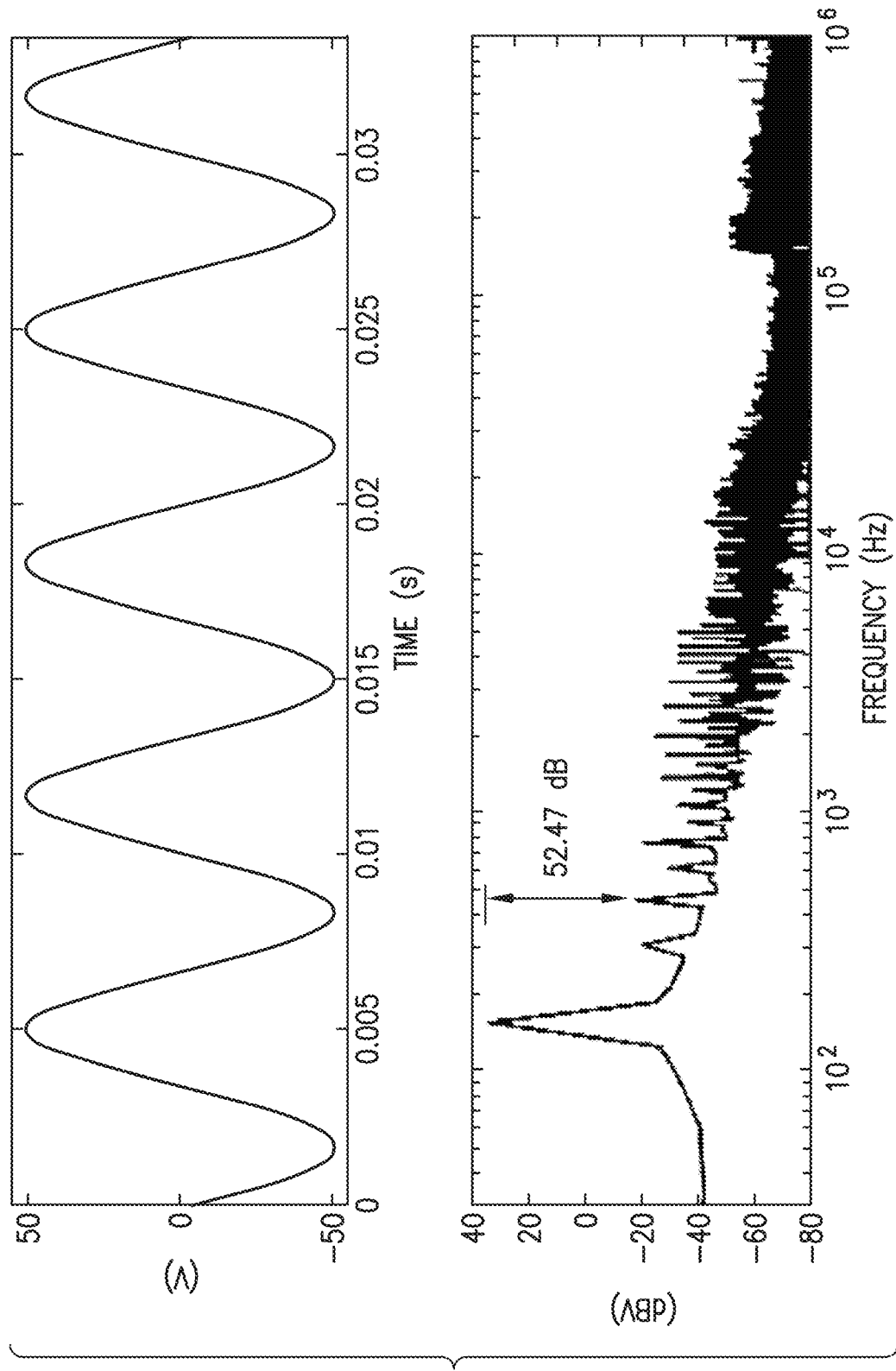
FIG. 15 is a plot of the output of the exemplary driver for a measured 101.8 Vpp, 150 Hz waveform in a 150 nF capacitive load and a plot of its spectrum having a 0.38% THD+N in a 1 MHz bandwidth.
Figure 16:
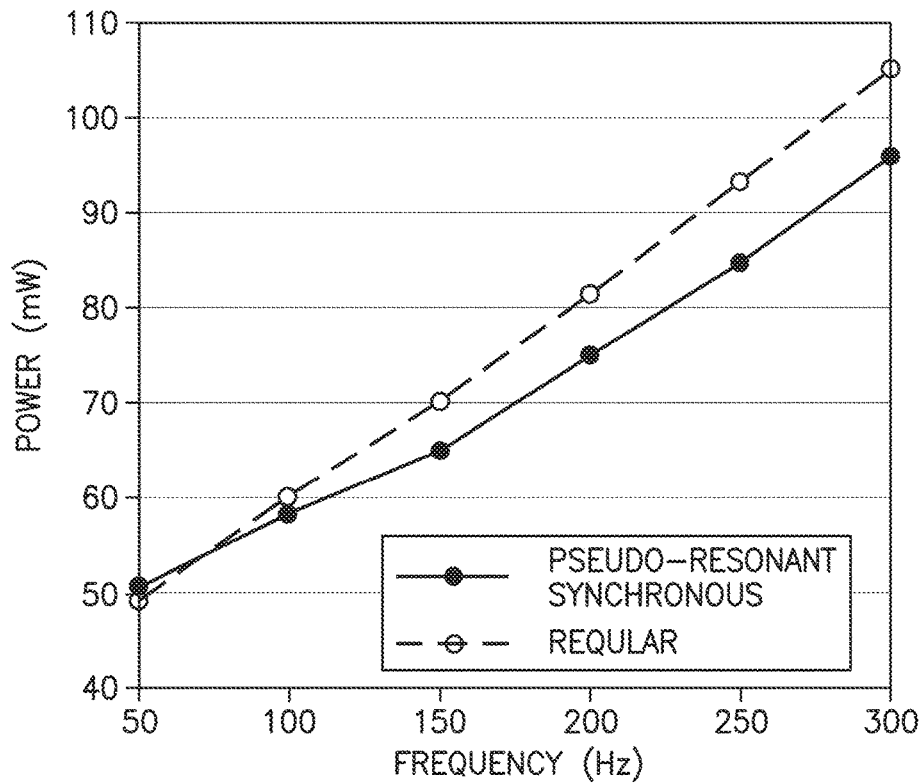
FIG. 16 is a plot demonstrating how a pseudo-resonant synchronous buck operation saves up to 8.9% power vs regular buck operation for a 100 Vpp output in a 150 nF capacitor from a 5 V input.

FIGS. 15 and 16 illustrate results using the prototype of FIG. 11. FIG. 15 presents a 150 Hz, 101.8 Vpp sinusoid in a 150 nF capacitive load generated with the prototype from a 3.6 V supply. Even without a magnetic output filter, the prototype achieves a THD+N of 0.38% in a 1 MHz bandwidth. The spectrum shows the switching noise of the converter in the hundreds of kHz range does not significantly degrade the waveform. At that operating point, the prototype consumes 64.04 mW, 40.00 mW from the power path and 24.04 mW from the controller excluding the FPGA. This result is 7.81 to 13.85 times lower than prior single-inductor solutions providing high-voltage low-distortion outputs. The pseudo-resonant synchronous buck mode achieves up to 8.9% reduction in power compared to regular buck mode as seen in FIG. 16.

It will be apparent to those skilled in the art that various modifications and variations can be made to the structure of the present invention without departing from the scope or spirit of the invention. For example, the exemplary drivers may be used with other types of piezoelectric actuators than a DCJ, for example, a haptic feedback actuator, or a micro robotics actuator. More generally, the exemplary drivers may be advantageous when used with any capacitive load that requires a high voltage/low distortion waveform, such as an electrostatic actuator like a micro-mirror, an electro-mechanical polymer, an electro-active polymer, or another type of MEMS device.

In addition to the benefits of the embodiments described above, another important benefit is to make the circuit compatible with a wide range of energy sources. For example, if connecting a bi-directional power converter to a certain type of battery as input energy source, with previous converters the battery might not be able to sink current (e.g. non-rechargeable batteries) or need to sink current in a very controlled way to avoid potential failures (e.g. Li-Ion). The unidirectional power addresses this problem, for example, during system integration.

In summary, embodiments of the driver under the present invention may include one or more of the following features:

1. A capacitive load drive circuit having a two-switch bi-directional power converter generating a low distortion analog waveform (without an output low-pass filter). Any circuit configuration of FIGS. 2A, 2B, 2C, and 2D is a viable circuit that may be interchanged depending on the specific capacitive load. Circuit configuration of FIGS. 2A, 2B, 2C, and 2D may be operated in synchronous or normal switching mode. Forward and reverse operation may use different modes. For instance, forward operation may use normal switching and reverse operation may use synchronous switching.

2. The output stage configurations from any of FIGS. 3A, 3B, 3C, 3D, and 3E may be appended to any circuit configuration of FIGS. 2A, 2B, 2C, and 2D to enable higher output peak-to-peak voltage. Also note that FIG. 3A can be modified by referencing to GND instead of $V_{in}$.

3. For the output stage 303 shown in FIG. 3C and the output stage 305 shown in FIG. 3E, the triangle symbol represents an amplifier to which one may feed a variable input $V_{ref}$ and control that side of the load 365.

4. Other output stage combinations (not shown) are also possible. For example, mixing FIGS. 3B and 3C or mixing FIGS. 3D and 3E provides for a very clean transition between the different voltage references (low distortion) while only having to pay the power cost of the amplifier during the transitions.

5. A method to reduce the converter switching losses and waveform distortion may be combined with any of the circuits above, providing for the generation of a variable pre-drive pulse to achieve zero voltage and zero-current switching of the high side switch under all operating conditions (pseudo-resonant operation).

6. A method to provide a unidirectional power input to increase power efficiency may be combined with one or more of the circuits described above, as described above.

7. The variable pre-drive pulse of 5 (above) may be computed by a digital controller.

8. The method of 5 may be implemented where the ZVS/ZCS point is detected through a current sensor.

9. The current sensor of 7 may be implemented wherein the current sensor is implemented as in FIG. 12.

10. The DAC enhancement of FIG. 10B may be implemented where the ZVS/ZCS point is detected through a current sensor.

11. The high side floating driver from FIG. 9 may be incorporated in the driver. Note that the minimum realization of that driver uses only D1, D2, C3 and Q7. The extra capacitor C2 provides increased noise tolerance. The diode D3 provides a faster charging path to increase the turn-on speed of Q5.

12. The control algorithm of FIG. 14B may be incorporated to further lower the output distortion.

Figure 17:
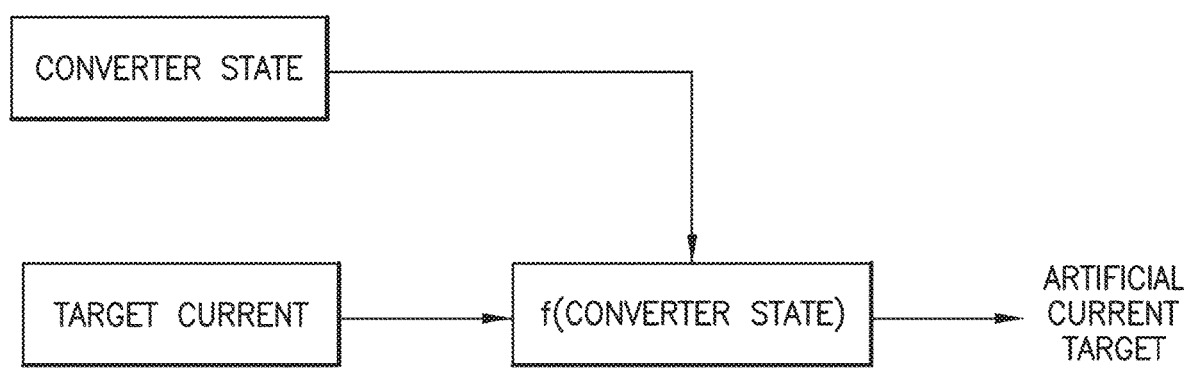
FIG. 17 is a schematic diagram of a real-time adjustment of the current target to achieve precise turn-on/turn-off behavior.

13. The real-time current adjustment of FIG. 17 may be incorporated.

14. The realization of the circuit may be monolithic for all switches (although some passive elements like the inductor may be discrete parts) and systems in packages (SiP) where for instance the controller and power circuit are on two different die, but the two dies may be included together in a single package. The circuit may also be implemented as a fully discrete realization or any compromise between full integration and full discrete implementation.

15. Part of or all power transistors may be implemented as a MEMS switch in some implementations.

These circuits may preferably drive a capacitive load, for example, (but not limited to) piezoelectric actuators, electroactive polymer actuators, or electrostatic actuators. In view of the foregoing, it is intended that the present invention cover modifications and variations of this invention provided they fall within the scope of the following claims and their equivalents.

What is claimed is:

1. A driver for a circuit with a capacitive load, comprising:
   a power converter configured to receive a DC input voltage from an input stage, generate a switching voltage at a switching node, and output an output voltage forming an analog waveform at an output stage, the power converter comprising:
   a first switch connected between an inductive device and a ground;
   a second switch connected between the inductive device and the output stage; and
   a controller to control the first switch and the second switch;
   wherein the analog waveform comprises an amplitude at least two times greater than the input voltage.

2. The driver according to claim 1, wherein the power converter comprises only two switches, the first switch and the second switch, and only one inductor, the inductive device for transferring energy from the input stage to the output stage.

3. The driver according to claim 1, wherein the controller is configured to:
   turn the first switch on, whereby an inductor current ramps up in the inductive device to a threshold current;
   turn the first switch off and turn the second switch on when the inductor current reaches the threshold current; and
   turn the second switch off and turn the first switch on when the inductor current reaches a target current thereby controlling the transfer of energy between the input stage and output stage, and controlling the output voltage.

4. The driver according to claim 3, wherein the controller is configured to:
   turn the second switch on when the switching voltage is substantially zero, whereby the second switch switches under a zero-voltage switching condition.

5. The driver according to claim 3, wherein the target current is about 0 mA or less, whereby the first switch turns on under a zero voltage switching condition.

6. The driver according to claim 5, further comprising a current sensor connected to the controller, and configured to determine when the inductor current is at the target current.

7. The driver according to claim 3, wherein the controller is configured to dynamically adapt a first switch current threshold required during reverse buck operation to achieve pseudo-resonant charging of the switching node up to the output voltage and achieve zero-voltage switching of the second switch; and wherein the power converter is configured to operate as a pseudo resonant synchronous buck converter configured to operate with an output to input voltage ratio greater than 10.

8. The driver according to claim 1, wherein the power converter comprises a forward boost/reverse buck converter; and wherein the power converter is configured to operate in a borderline conduction mode (BCM).

9. The driver according to claim 6, wherein the controller is configured to dynamically change an output to input voltage ratio.

10. The driver according to claim 1, wherein the analog waveform comprises a clean folded waveform, and the driver further comprises an unfolding stage arranged to receive the clean folded waveform from the power converter and unfold the clean folded waveform into a full waveform.

11. The driver according to claim 10, wherein the unfolding stage comprises a full-bridge configuration, further comprising a plurality of power switches configured to double an effective output signal across the capacitive load.

12. The driver according to claim 11, wherein the full-bridge configuration is referenced to the input voltage.

13. The driver according to claim 11, wherein the full-bridge configuration includes a variable reference voltage configured to alternate between a plurality of reference voltages, including the input voltage and the ground.

14. The driver according to claim 11, wherein the plurality of power switches comprises at least one high side switch and at least one low side switch, and the at least one high-side switch is controlled with a charge pump comprising two diodes and a capacitor to directly control a gate of the high side switch.

15. The driver according to claim 1, wherein the capacitive load comprises a piezoelectric actuator configured to provide haptic feedback.

16. The driver according to claim 1, further comprising a device configured to enable current flow from a power supply to the driver, and block current flow from flowing back to the power supply.

17. The driver according to claim 16, wherein the device comprises a diode.

18. The driver according to claim 16, wherein the device comprises an active switch controlled by the controller, the controller configured to close the active switch to enable current from the power supply to the driver, and to open the active switch to prevent current from flowing back to the power supply.

19. The driver according to claim 1, wherein active devices of the input stage, the power converter, and the controller are implemented upon a single die.

20. The driver according to claim 1, wherein the analog waveform is in a range of 50 Hz to 300 Hz with a voltage greater than 50 V, and a voltage ratio between the input voltage and the output voltage of greater than 10.

21. A driver for a circuit with a capacitive load, comprising:

a power converter configured to receive a DC input voltage from an input stage, and output an output voltage forming an analog waveform at an output stage, the power converter comprising:
a bidirectional power converter; and
a device configured to enable current flow from a power supply to the input stage, and block current flow from flowing back from the input stage to the power supply; and
a capacitor disposed between the input stage and GND to locally store energy recovered by the power converter.

* * * * *